United States Patent
Pandey et al.

(10) Patent No.: US 8,635,194 B2
(45) Date of Patent: Jan. 21, 2014

(54) SYSTEM AND METHOD FOR DATA COMPRESSION

(75) Inventors: Dheeraj Pandey, Santa Clara, CA (US); Bharath Aleti, Santa Clara, CA (US); Joy Forsythe, Cambridge, MA (US); Amit Ganesh, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 1476 days.

(21) Appl. No.: 11/584,415

(22) Filed: Oct. 19, 2006

(65) Prior Publication Data

US 2008/0144079 A1   Jun. 19, 2008

(51) Int. Cl.
   G06F 7/00       (2006.01)
   G06F 17/30      (2006.01)

(52) U.S. Cl.
   USPC ............ 707/693; 707/802; 386/328; 709/247

(58) Field of Classification Search
   USPC .................. 707/999.001, 693, 802; 709/247; 386/328
   See application file for complete search history.

(56) References Cited

U.S. PATENT DOCUMENTS

| | | | |
|---|---|---|---|
| 6,343,293 B1 * | 1/2002 | Lyle ....................... | 707/999.101 |
| 6,349,308 B1 | 2/2002 | Whang et al. | |
| 6,377,993 B1 * | 4/2002 | Brandt et al. ................. | 709/227 |
| 6,460,044 B1 * | 10/2002 | Wang ................................... | 1/1 |
| 6,567,928 B1 * | 5/2003 | Lyle et al. ........................ | 714/15 |
| 6,598,161 B1 * | 7/2003 | Kluttz et al. .................. | 713/166 |
| 6,910,094 B1 | 6/2005 | Eslinger et al. | |
| 6,947,556 B1 | 9/2005 | Matyas et al. | |
| 6,957,236 B1 | 10/2005 | Ganesh et al. | |
| 6,976,022 B2 | 12/2005 | Vemuri et al. | |
| 6,981,004 B2 | 12/2005 | Ganesh et al. | |
| 7,036,149 B2 | 4/2006 | Sonoda et al. | |
| 7,062,515 B1 | 6/2006 | Thomas et al. | |
| 7,146,501 B2 | 12/2006 | Tanaka | |
| 7,200,604 B2 | 4/2007 | Forman et al. | |
| 7,418,544 B2 | 8/2008 | Mukherjee et al. | |
| 7,467,163 B1 * | 12/2008 | Dodds et al. ........... | 707/999.104 |
| 7,496,586 B1 * | 2/2009 | Bonwick et al. ....... | 707/999.101 |
| 7,546,364 B2 | 6/2009 | Raman et al. | |
| 2003/0065656 A1 | 4/2003 | de la Torre et al. | |
| 2004/0010621 A1 * | 1/2004 | Afergan et al. ............... | 709/247 |
| 2004/0172336 A1 | 9/2004 | Forsell et al. | |

(Continued)

OTHER PUBLICATIONS

Final Office Action dated Jan. 21, 2010 for U.S. Appl. No. 11/584,782.

(Continued)

*Primary Examiner* — Vincent F Boccio
(74) *Attorney, Agent, or Firm* — Vista IP Law Group, LLP

(57) ABSTRACT

A method of processing data from a file includes obtaining a first portion of the file, creating a first compression unit by compressing at least the first portion of the file, obtaining a second portion of the file, creating a second compression unit by compressing at least the second portion of the file, and storing the first and second compression unit such that each of the first and the second compression units can be individually accessed. A method of processing data from a file includes receiving a request to access a portion of the file, determining one or more sub-units that include compressed data associated with the portion of the file, de-compressing the compressed data in the one or more sub-units to obtain de-compressed data, and transmitting the de-compressed data in response to the request.

55 Claims, 17 Drawing Sheets

(56) References Cited

U.S. PATENT DOCUMENTS

| | | |
|---|---|---|
| 2007/0083473 A1 | 4/2007 | Farrugia et al. |
| 2007/0088912 A1 | 4/2007 | Mukherjee et al. |
| 2008/0098083 A1 | 4/2008 | Shergill et al. |
| 2008/0098236 A1 | 4/2008 | Pandey et al. |
| 2008/0144079 A1 | 6/2008 | Pandey et al. |
| 2008/0281846 A1 | 11/2008 | Hoang et al. |
| 2009/0024578 A1 | 1/2009 | Wang et al. |
| 2009/0030956 A1 | 1/2009 | Zhang et al. |
| 2009/0037366 A1 | 2/2009 | Shankar et al. |
| 2009/0037495 A1 | 2/2009 | Kumar et al. |
| 2009/0037498 A1 | 2/2009 | Mukherjee et al. |
| 2009/0037499 A1 | 2/2009 | Muthulingam et al. |
| 2009/0106281 A1 | 4/2009 | Marwah et al. |

OTHER PUBLICATIONS

Office Action dated Jul. 29, 2009 for U.S. Appl. No. 11/584,782.

Microsoft Computer Dictionary Fifth Edition 2002. Page 6 of 21.

Non-Final Office Action dated Jun. 9, 2010 for U.S. Appl. No. 11/584,144.

Non-Final Office Action dated Jul. 14, 2010 for U.S. Appl. No. 11/584,782.

Notice of Allowance dated Nov. 30, 2010 for U.S. Appl. No. 11/584,144.

Final Office Action dated Dec. 15, 2010 for U.S. Appl. No. 11/584,782.

* cited by examiner

⟵ 300

| Hash Value | LOB Identifier | De-duplication Flag | Count | Storage Address |
|---|---|---|---|---|
| H3 | XYZ | ON | 1 | A1 |
| . 302 | . 304 | . 310 | . ~308 | . 306 |
| . | . | . | . | . |

| Hash Value | Index |
|---|---|
| H3 | I6 |
| . | . |
| . | . |

352

| Index | LOB ID | Address | Count | De-dup Flag |
|---|---|---|---|---|
| I6 | XYZ | A1 | 1 | ON |
| . | . | . | . | . |
| . | . | . | . | . |

| Hash Value | Index | De-dup Flag |
|---|---|---|
| H3 | I6 | ON |
| . | . | . |
| . | . | . |

352

| Index | LOB ID | Address | Count |
|---|---|---|---|
| I6 | XYZ | A1 | 1 |
| . | . | . | . |
| . | . | . | . |

| Hash Value | LOB Identifier | De-duplication Flag | Count | Storage Address |
|---|---|---|---|---|
| H3 | XYZ, ABC | ON | 2 | A1 |
| . | . | . | . | . |
| . | . | . | . | . |
| . | . | . | . | . |

FIG. 5A

| Hash Value | LOB Identifier | De-duplication Flag | Count | Storage Address |
|---|---|---|---|---|
| H3 | XYZ | OFF | 1 | A1 |
| H3 | ABC | OFF | 1 | B1 |
| . | . | . | . | . |
| . | . | . | . | . |
| . | . | . | . | . |

| Hash Value | LOB Identifier | De-duplication Flag | Count | Storage Address |
|---|---|---|---|---|
| H3 | ABC | ON | 1 | A1 |
| 302 | 304 | 310 | 308 | 306 |
| . | . | . | . | . |

| Hash Value | LOB Identifier | De-duplication Flag | Count | Storage Address |
|---|---|---|---|---|
| H3<br>302 | XYZ<br>304 | ON<br>310 | 2<br>308 | B1 250 A1<br>B2 250 A2<br>B3 248 A3<br>B4 252 A4<br>B5 30 A5 |
| . | . | . | . | . |

| CU1 | | | |
|---|---|---|---|
| Block | Block Size | Compression Size | Address |
| B1 | 250 | 10 | SUA1 |
| B2 | 250 | 20 | SUA2 |

650b, 650a, 652b, 652a, 654b, 654a, 656b, 656a

← 502b

| CU2 | | | |
|---|---|---|---|
| Block | Block Size | Compression Size | Address |
| B3 | 248 | 5 | SUA3 |
| B4 | 252 | 30 | SUA4 |

650d, 650c, 652d, 652c, 654d, 654c, 656d, 656c

← 502c

| CU3 | | | |
|---|---|---|---|
| Block | Block Size | Compression Size | Address |
| B5 | 30 | 30 | SUA5 |

| Hash Value | LOB Identifier | De-Duplication Flag | Count | Data Comp Flag | Data Comp Level | Data Comp Algorithm | Comp Unit | Size | Address | Encryption Flag | Key Location |
|---|---|---|---|---|---|---|---|---|---|---|---|
| H3 | XYZ | ON | 2 | ON | High | AL2 | CU1<br>CU2<br>CU3 | 500<br>500<br>30 | A1<br>A2<br>A3 | ON | K1 |
| ... | ... | ... | ... | ... | ... | ... | ... | ... | ... | ... | ... |

| Hash Value | LOB Identifier | De-Duplication Flag | Count | Data Comp Flag | Data Comp Level | Data Comp Algorithm | Comp Unit | Size | Address | Encryption Flag | Key Location |
|---|---|---|---|---|---|---|---|---|---|---|---|
| H3 | XYZ | ON | 2 | ON | High | AL2 | CU1<br>CU2<br>CU3 | 500<br>500<br>30 | A1<br>A2<br>A3 | ON<br>OFF<br>ON | K1<br>-<br>K2 |
| ... | ... | ... | ... | ... | ... | ... | ... | ... | ... | ... | ... |

302, 304, 310, 308, 602, 604, 606, 608, 610, 612, 800, 802 — 300

SYSTEM AND METHOD FOR DATA COMPRESSION

RELATED APPLICATION DATA

This application is related to U.S. Application Ser. No. 11/584,782, entitled "System and method for data de-duplication", and U.S. Application Ser. No. 11/584,144, entitled "System and method for data encryption".

FIELD

This application relates generally to systems and methods for storing and accessing data, and more specifically, to systems and methods for storing and accessing LOB data.

BACKGROUND

Files, such as LOB files, serve the goal of providing a content-rich store for data. Some applications give rise to the duplicated storage of LOB data, and thereby waste a significant amount of storage space. The ability to identify LOBs that have identical content and for those LOBs to share a single data repository is therefore desirable.

LOB data, residing in mainline or archived storage devices, can grow into very large sizes. This provides disk space and disk management challenges to administrators. Data compression is a commonly used mechanism to minimize disk space requirements. It is thus desirable to compress LOB data and provide random access to compressed data. In existing approaches, an algorithm is used to compress or decompress a source LOB to a destination LOB. The destination LOB is either a temporary LOB or an existing LOB, in which case it is overwritten. This technique requires creation of an explicit destination LOB and does not provide random access to LOB data.

Another problem with existing technique for storing LOB data is that the LOB data is stored unencrypted on-disk. However, in many cases, securing sensitive information is critical for meeting business and compliance requirements.

SUMMARY

In accordance with some embodiments, a method of processing data from a file includes obtaining a first portion of the file, creating a first compression unit by compressing at least the first portion of the file, obtaining a second portion of the file, creating a second compression unit by compressing at least the second portion of the file, and storing the first and second compression unit such that each of the first and the second compression units can be individually accessed.

In accordance with other embodiments, a system for processing data from a file includes means for obtaining a first portion and a second portion of the file, means for creating a first compression unit and a second compression unit, wherein the means for creating the first compression unit creates the first compression unit by compressing at least the first portion of the file, and creates the second compression unit by compressing at least the second portion of the file, and means for storing the first and second compression unit such that each of the first and the second compression units can be individually accessed.

In accordance with other embodiments, a computer product having a computer-useable medium storing a set of instruction, wherein an execution of the instruction causes a process to be performed, the process includes obtaining a first portion of the file, creating a first compression unit by compressing at least the first portion of the file, obtaining a second portion of the file, creating a second compression unit by compressing at least the second portion of the file, and storing the first and second compression unit such that each of the first and the second compression units can be individually accessed.

In accordance with other embodiments, a method of processing data from a file includes obtaining a first portion of the file, obtaining a second portion of the file, creating a compression unit having a first sub-unit and a second sub-unit, wherein the first sub-unit is created by compressing the first portion of the file, and the second sub-unit is created by compressing the second portion of the file, and storing the first and second sub-units such that each of the first and the second sub-units can be individually accessed.

In accordance with other embodiments, a system for processing data from a file includes means for obtaining a first portion and a second portion of the file, means for creating a compression unit having a first sub-unit and a second sub-unit, wherein the first sub-unit is created by compressing the first portion of the file, and the second sub-unit is created by compressing the second portion of the file, and means for storing the first and second sub-units such that each of the first and the second sub-units can be individually accessed.

In accordance with other embodiments, a computer product having a computer-useable medium storing a set of instruction, wherein an execution of the instruction causes a process to be performed, the process includes obtaining a first portion of the file, obtaining a second portion of the file, creating a compression unit having a first sub-unit and a second sub-unit, wherein the first sub-unit is created by compressing the first portion of the file, and the second sub-unit is created by compressing the second portion of the file, and storing the first and second sub-units such that each of the first and the second sub-units can be individually accessed.

In accordance with other embodiments, a method of processing data from a file includes receiving a request to access a first portion of the file, wherein data in the first portion of the file is compressed, and data in a second portion of the file is compressed, and de-compressing the data in the first portion, and not the data in the second portion.

In accordance with other embodiments, a system for processing data from a file includes means for receiving a request to access a first portion of the file, wherein data in the first portion of the file is compressed, and data in a second portion of the file is compressed, and means for de-compressing the data in the first portion, wherein the means for de-compressing the data in the first portion is capable of de-compressing the data in the first portion without de-compressing the data in the second portion.

In accordance with other embodiments, a computer product having a computer-useable medium storing a set of instruction, wherein an execution of the instruction causes a process to be performed, the process includes receiving a request to access a first portion of the file, wherein data in the first portion of the file is compressed, and data in a second portion of the file is compressed, and de-compressing the data in the first portion, and not the data in the second portion.

In accordance with other embodiments, a method of processing data from a file includes receiving a request to access a portion of the file, determining one or more sub-units that include compressed data associated with the portion of the file, de-compressing the compressed data in the one or more sub-units to obtain de-compressed data, and transmitting the de-compressed data in response to the request.

In accordance with other embodiments, a system for processing data from a file includes means for receiving a request to access a portion of the file, means for determining one or more sub-units that include compressed data associated with the portion of the file, means for de-compressing the compressed data in the one or more sub-units to obtain de-compressed data, and means for transmitting the de-compressed data in response to the request.

In accordance with other embodiments, a computer product having a computer-useable medium storing a set of instruction, wherein an execution of the instruction causes a process to be performed, the process includes receiving a request to access a portion of the file, determining one or more sub-units that include compressed data associated with the portion of the file, de-compressing the compressed data in the one or more sub-units to obtain de-compressed data, and transmitting the de-compressed data in response to the request.

Other aspects and features will be evident from reading the following detailed description of the embodiments.

BRIEF DESCRIPTION OF THE DRAWINGS

The drawings illustrate the design and utility of embodiments, in which similar elements are referred to by common reference numerals. In order to better appreciate how advantages and objects of the embodiments are obtained, a more particular description of the embodiments will be illustrated in the accompanying drawings.

FIG. 4A illustrates metadata associated with a stored file in accordance with some embodiments, particularly showing file "XYZ" having been stored;

FIG. 4B illustrates metadata associated with a stored file in accordance with other embodiments;

FIG. 4C illustrates metadata associated with a stored file in accordance with other embodiments;

FIG. 5A illustrates metadata associated with a stored file in accordance with some embodiments, particularly showing two files, "XYZ" and "ABC" having the same data that are stored once;

FIG. 5B illustrates metadata associated with two stored files in accordance with some embodiments, particularly showing two files, "XYZ" and "ABC" having the same data that are stored twice;

FIG. 6 illustrates metadata associated with a stored file in accordance with some embodiments, particular showing that the file "XYZ" has been removed;

FIG. 7 illustrates metadata associated with a stored file in accordance with some embodiments, particularly showing that the file is separated into a plurality of blocks;

FIG. 12 illustrates data compression maps associated with the compression units of FIG. 10 in accordance with some embodiments;

FIG. 16A illustrates metadata of a stored file in accordance with some embodiments, particularly showing metadata having information regarding data encryption;

FIG. 16B illustrates metadata of a stored file in accordance with other embodiments, particularly blocks of the file having their respective data encryption information;

DETAILED DESCRIPTION OF THE EMBODIMENTS

Figure 1:
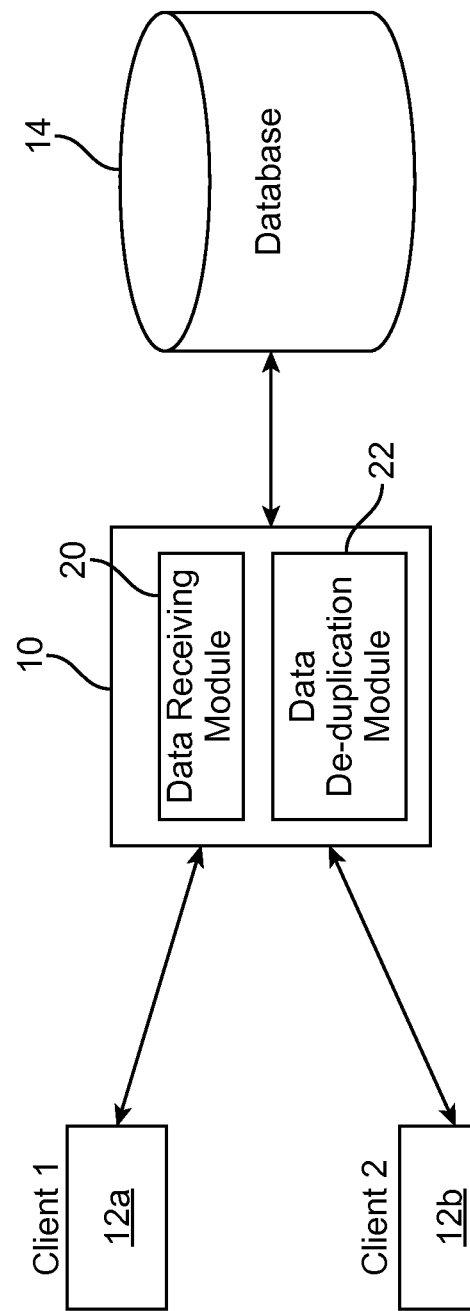
FIG. 1 illustrates a system having a data receiving module and a data de-duplication module in accordance with some embodiments.

Various embodiments are described hereinafter with reference to the figures. It should be noted that the figures are not drawn to scale and elements of similar structures or functions are represented by like reference numerals throughout the figures. It should also be noted that the figures are only intended to facilitate the description of embodiments. They are not intended as an exhaustive description of the invention or as a limitation on the scope of the invention. In addition, an aspect described in conjunction with a particular embodiment is not necessarily limited to that embodiment and can be practiced in any other embodiments.

De-Duplication

FIG. 1 illustrates a system 10 configured to process data in accordance with some embodiments. In the illustrated embodiments, the system 10 is configured to receive a request from a client 12 to store data, receive the data, process the data, and store the data in a database 14 so that the data can be accessed at a later time. The client 12 may be a computer, or a handheld device, such as a phone, a PDA, a MP3 player, or other devices. In the illustrated embodiments, the clients 12a, 12b are communicatively connected to the system 10 via the internet. Alternatively, the clients 12a, 12b may be communicatively coupled to the system 10 using other techniques, such as, through a cable, or Bluetooth technology. Although only two clients 12a, 12b are shown, it should be understood that the system 10 may communicate with more than two clients 12. In the illustrated embodiments, the database 14 is communicatively coupled to the system 10. In other embodiments, the database 14 may be a part of the system 10. The system 10 may be implemented using a hardware, such as a computer, or a processor. In other embodiments, the system 10 may be implemented using software. In further embodiments, the system 10 may be implemented using a combination of hardware and software.

In the illustrated embodiments, the system is configured to receive LOB file from a client. The LOB file may have a large size, e.g., a size that is larger than 500 kb, and more particularly, a size that is larger than 1 Mb. Alternatively, the LOB file may have other sizes. In some embodiments, the LOB file may be an image file (e.g., a .gif file) or an audio file (e.g., a MP3 file). In other embodiments, the LOB file may be of other data types. In further embodiments, the system is configured to receive other type of files or objects from client(s) 12.

As shown in FIG. 1, the system 10 includes a data receiving module 20 and a de-duplication module 22. The data receiving module 20 is configured to receive and pass data to the de-duplication module 22 in a manner prescribed by the system 10. The de-duplication module 20 is configured to analyze data received from a client 12, and determine whether the received data is already stored at database 14. In some cases, if the data is already stored at the database 14, and duplication of the stored data is not desired, the de-duplication module 20 then updates the database 14 to reflect the fact that more than one client 12 has requested the same data be stored. In such cases, the duplication module 22 would not store an additional copy of the data. In other cases, if the data is already stored at the database 14, and duplication of the stored data is desired, the de-duplication module 20 may then store the additional data even though a copy of which is already stored at the database 14.

Figure 2:
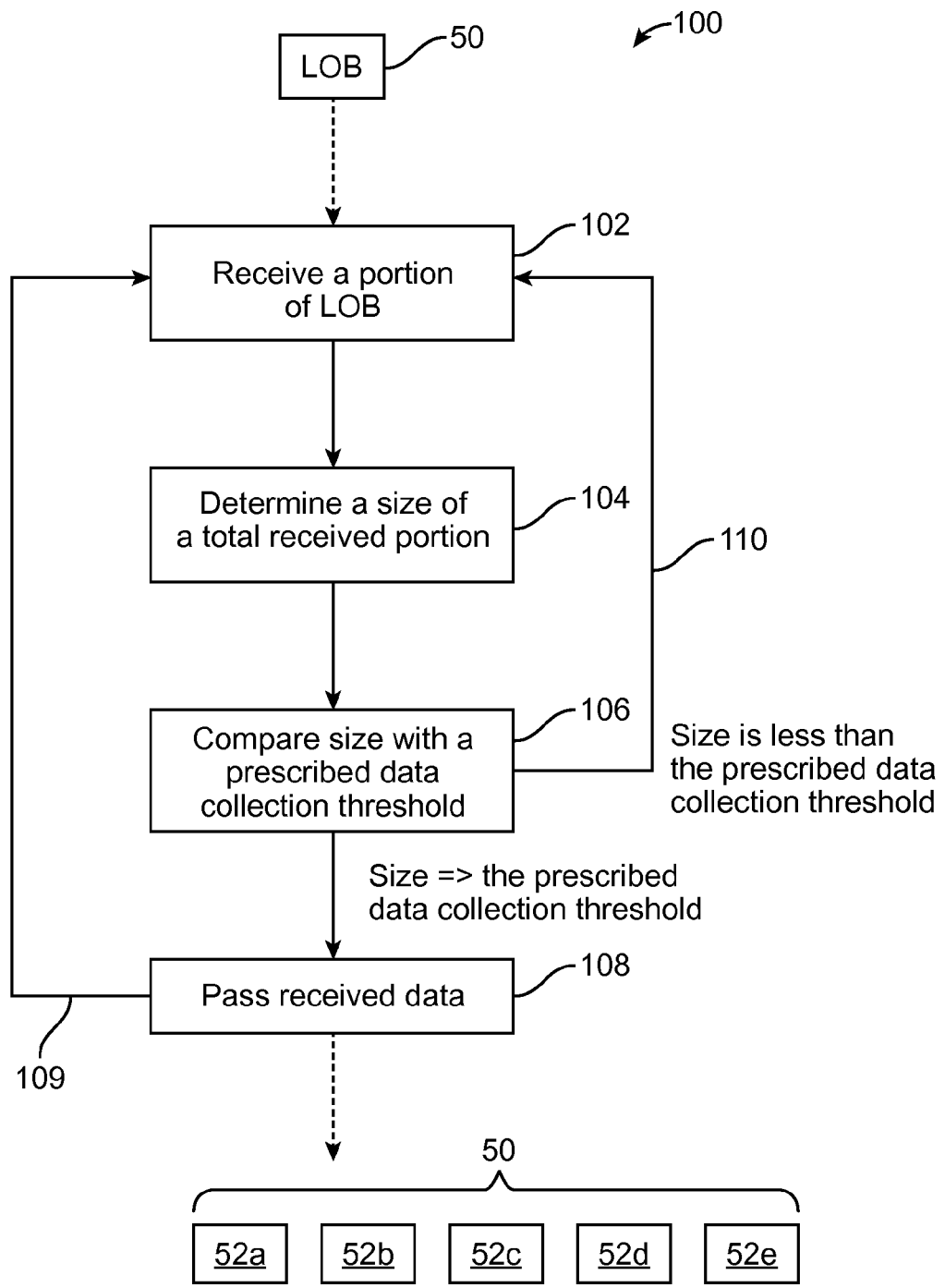
FIG. 2 illustrates a process performed by the data receiving module of FIG. 1 in accordance with some embodiments.

FIG. 2 illustrates an example of a process 100 that is performed by the data receiving module 20 in accordance with some embodiments. In the illustrated example, the data requested by a client 12 (e.g., client 12a) to be stored by the system 10 is a LOB file 50. However, it is understood that the system 10 can be configured to store other types of data. First, the data receiving module 20 receives a portion of the LOB file 50 (Step 102). Next, the data receiving module 20 determines a size of the total received portion (Step 104). The data receiving module 20 then compares the size with a prescribed data processing threshold (Step 106). The data processing threshold may be, for examples, 260 kB, 1 MB, or other values set by a user. If the size of the cumulative collected data is equal or larger than the prescribed data processing threshold, the data receiving module 20 then passes the collected data (e.g., block 52a) downstream for further processing, and continues to collect the remaining portions of the LOB file 50 (Step 109). On the other hand, if the size of the cumulative collected data is less than the prescribed data processing threshold, the data receiving module 20 then continues to collect additional portions of the LOB file 50 (Step 110) until the size of the total collected portions reach the prescribed data processing threshold. As a result of the process 100, the LOB file 50 is passed downstream (e.g., to the de-duplication module 22) in the form of blocks 52 (e.g., blocks 52a-52e in the example), each of which having a size that is equal or less then the prescribed processing threshold. Although five blocks 52 are shown in the example, in other examples, the file 50 may be separated into other numbers of portions/blocks 52. Such technique is advantageous in that the de-duplication module 22 does not need to wait for an entire LOB file 50 to be collected before it starts analyzing the data of the LOB file. Also, in some cases, if the de-duplication module 22 (or another processing unit downstream) does not have enough memory to store the entire LOB file, the above data passing technique would allow the de-duplication module 22 (or another processing unit downstream) to process the data of the LOB file 50.

In the illustrated embodiments, the system 10 includes a user interface that allows a user, such as an administrator, to input the prescribed data processing threshold. The user interface may include, for example, a screen, a keyboard, and a mouse. Also, in some embodiments, the user interface may allow a user to activate or deactivate the data receiving module 20. If the data receiving module 20 is deactivated, data of the LOB file 50 received from the client 12 would be transmitted to the de-duplication module 22 without being processed by the data receiving module 20.

Figure 3:
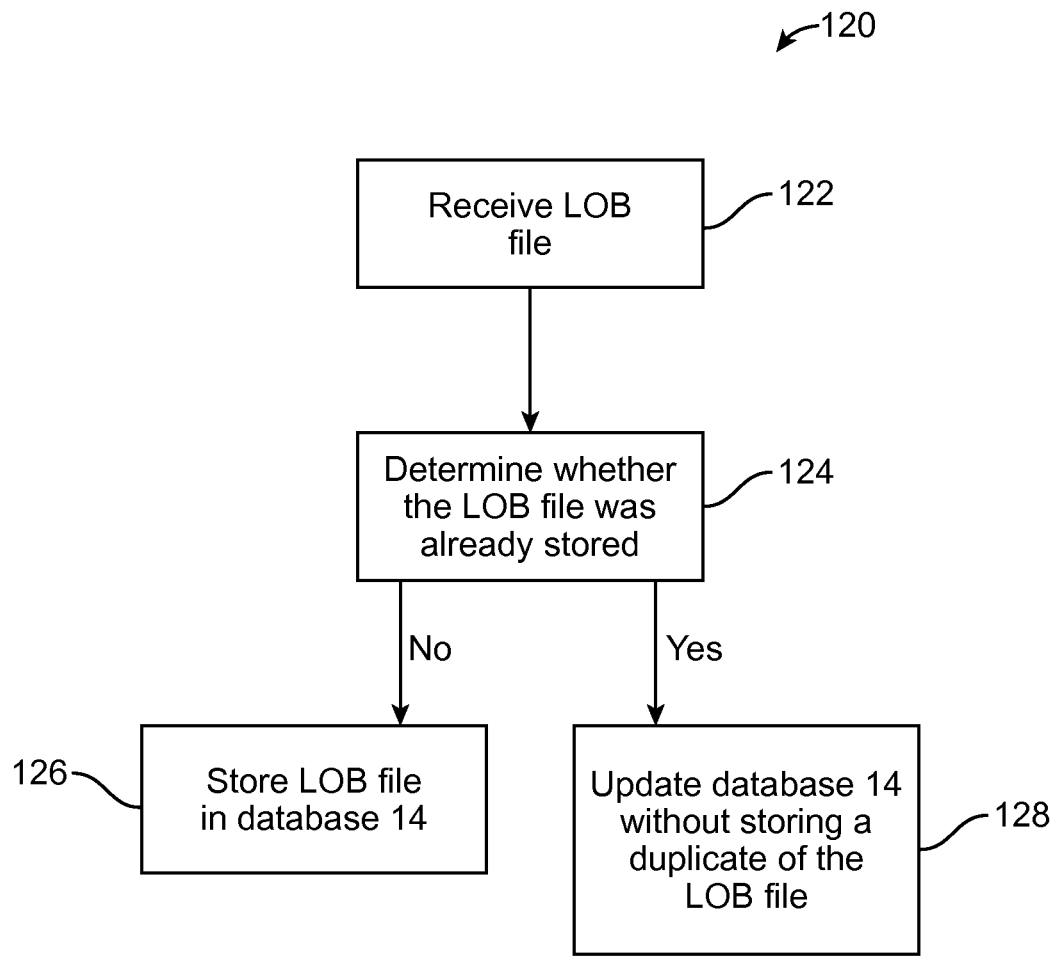
FIG. 3 illustrates a process performed by the data de-duplication module of FIG. 1 in accordance with some embodiments.

FIG. 3 illustrates a process 120 that is performed by the de-duplication module 22 in accordance with some embodiments. As shown in the figure, the de-duplication module 22 receives the LOB file 50 (Step 122), and determines whether the LOB file 50 was already stored (Step 124). Various techniques may be used to determine whether a LOB file has been stored previously. In some embodiments, the de-duplication module 22 is configured to calculate a hash value associated with the LOB file using an algorithm such as SHA1 or MD5. In such case, as the LOB file data is being received or written to a storage or temporary memory, a rolling hash value for the portion of the LOB file that has been received is calculated. A final hash value of the LOB file data is calculated at completion of the writing process, which uniquely identifies the LOB file data. In some embodiments, a B-tree may be used to maintain the calculated rolling hash value(s). Any of the techniques known in the art may be used to calculate the hash value.

For example, upon receiving the first block 52a of the LOB file 50, the de-duplication module 22 then calculates a hash value for the block 52a. The de-duplication module 22 then checks to see if the calculated hash value can be found in the database 14. For example, the de-duplication module 22 can look up a hash value table or a B-tree. If the calculated hash value cannot be found, then the de-duplication module 22 determines that the LOB file 50 is not yet stored by the system 10. Alternatively, if the calculated hash value can be found, the de-duplication module 22 then continues to receive the next block 52b of the LOB file 50, and calculates a second hash value using the data from block 52b. The de-duplication module 22 then checks the database 14 again to see if the second calculated hash value can be found. If the second calculated hash value cannot be found, then the de-duplication module 22 determines that the LOB file 50 is not yet stored by the system 10. Alternatively, if the second calculated hash value can be found, the de-duplication module 22 then continues to receive the next block 52c of the LOB file, and calculates a third hash value using the data from block 52b. The above process is repeated until the last block 52 (e.g., block 52e) of the LOB file 50 is received and processed. If the last calculated hash value cannot be found, then the de-duplication module 22 determines that the LOB file 50 is not yet stored by the system 10. Alternatively, if the last calculated hash value can be found, then the de-duplication module 22 determines that the LOB file 50 is already stored in database 14.

In other embodiments, instead of performing a hash lookup for each of the blocks, the hash lookup may be performed after the LOB file 50 has been received. For example, the system 10 may be configured to detect an end of file (EOF), and upon detecting the EOF, the system 10 then performs data de-duplication, as discussed herein. Such technique may have the benefit of reducing consumption of CPU resource.

In the above embodiments, the data receiving module 20 passes portions of the LOB file 50 to the de-duplication module 22, thereby allowing the de-duplication module 22 to process blocks 52 of the LOB file 50 have certain prescribed size. However, in other embodiments, the system 10 may not include the data receiving module 20. In such cases, the de-duplication module 22 receives the entire LOB file 50 before it starts processing the LOB file 50. Also, in further embodiments, the de-duplication module 22 may not need to calculate hash value(s). For example, in other embodiments, the calculation of hash value(s) for the LOB file 50 may be performed by another system (e.g., another computer or software that may communicate with the system 10 using the internet or other communication devices), or by the client 12. In such cases, the de-duplication module 22 receives the hash value(s) and determines whether the LOB file 50 desired to be stored by the client 12 is already stored by the system 10 based on the received hash value(s).

Returning to FIG. 3, if the de-duplication module 22 determines that the LOB file 50 is not already stored, the de-duplication module 22 then stores the LOB file 50 in the database 14 (Step 126). In some embodiments, the system 10 is configured to receive the entire LOB file 50 before it is passed downstream to be stored. In other embodiments, the system 10 allows a data collection threshold to be inputted (e.g., via a user interface). In such cases, data of the LOB file 50 is passed downstream to be stored based on the prescribed data collection threshold. For example, the system 10 may be configured to monitor the size of the portion of the LOB file 50 that has been processed by the de-duplication module 22. When the size of the portion reaches or exceeds the prescribed data collection threshold, the system 10 then stores the portion of the LOB file 50.

In the illustrated embodiments, the system 10 also maintains metadata regarding the stored LOB file 50. FIG. 4A illustrates a table 300 of metadata for the LOB file 50 that may be stored in the database 14. As shown in the figure, the metadata includes the final calculated hash value 302 that uniquely identifies the LOB file 50, an identifier 304 of the LOB file 50, an address 306 of the physical storage location that stores the LOB file data, a counter 308, and a de-duplication flag 310. The identifier 304 of the LOB file 50 may be prescribed by the client (e.g., client 12a), and may be the name of the LOB file 50 that the client 12 wishes to use. In the illustrated example, the client 12a has requested that the name "XYZ" be used for the LOB file 50. The address 306 may be implemented using a pointer that points to the physical storage location storing the LOB file data. In the illustrated example, the physical address 306 for the LOB file 50 "XYZ" is "A1." The counter 308 represents the total number of client(s) 12 that have requested the same LOB file data to be stored by the system 10. In the illustrated example, since the client 12a is the first one that requested the LOB file 50 be stored, the counter 308 is set to "1." The de-duplication flag 310 is used to indicate whether duplication of already stored data is desired. In the illustrated example, the de-duplication flag 310 for the LOB file is set to "ON," indicating that no duplication of already stored data is desired. Alternatively, setting the de-duplication flag 310 to "OFF" would indicate that duplication of already stored data is desired.

In the illustrated embodiments, the system 10 may include a user interface that allows a user, such as an administrator, to input the de-duplication flag 310 information. For example, the user may input certain file type(s) for which data de-duplication is desired. In other examples, the user may input a source address for which data de-duplication is desired. In such case, if the system 10 receives data from the prescribed source address, the system 10 then performs data de-duplication. In other embodiments, the whether to perform data de-duplication may be determined by the client 12 transmitting the LOB file 50. For example, the client 12 may transmit the LOB file 50 to the system 10, and requesting the system 10 to perform data de-duplication. In such cases, the system 10 determines that data de-duplication is desired if it receives a request from the client 12 to perform data de-duplication.

It should be noted that various techniques may be used to store the LOB file data and the metadata for the LOB file 50, and that the system 10 should not be limited to using the example of the table 300 shown. For example, in other embodiments, the database 14 may include a hash value table 350 that identifies a unique index 352 for each hash value, and an index table 360 that contains metadata for each index value 352 (FIG. 4B). In such cases, after the de-duplication module 22 calculates the unique hash value 302 for the LOB file 50, the de-duplication module 22 then assigns and associates an index 352 with the hash value 302. The index 352 may be used to retrieve metadata for the LOB file, and/or access the LOB file. For example, as shown in the figure, once the index 352 has been determined, the index table 360 may be used to obtain the address (which is "A1" in the example) of the physical location storing the LOB file data. In further embodiments, the metadata for the LOB file 50 may be stored using other techniques (e.g., using more than two tables), and may or may not be in table form.

In any of the embodiments described herein, the de-duplication flag 310 may be contained in the table 350, instead of table 360 (FIG. 4C).

Referring again to FIG. 3, if the de-duplication module 22 determines that the LOB file 50 is already stored, the de-duplication module 22 then updates the database 14 (Step 128). Following the above example, assuming client 12b now transmits a request to the system 10 requesting that a LOB file having identifier "ABC" be stored, wherein the LOB file data is the same as that of file "XYZ" stored for client 12a. Because the LOB data for files "XYZ" and "ABC" are the same, the calculated hash value for the file "ABC" would be the same as the hash value for the "XYZ" file. The de-duplication module 22, upon checking the table 300, will determine that data being the same as that of the file "ABC" is already stored by the system 10 because the calculated hash value ("H3" in the example) can be found. The de-duplication module 22 then checks the table 300 to see if the already stored LOB file has a de-duplication flag 310 that is set "ON." In the illustrated example, the LOB file associated with the hash value H3 has a de-duplication flag 310 that is set to "ON," indicating that there should not be any duplication of the LOB file data. As a result, the de-duplication module 22 does not store a duplicate copy of the LOB file data, but updates the database 14 by incrementing the counter value 308 by one (e.g., from "1" to "2"), indicating that there are now two clients 12 (clients 12a and 12b in the example) that have requested the same LOB file data to be stored by the system 10 (FIG. 5A). The de-duplication module 22 also updates the database 14 by inserting a LOB identifier "ABC" prescribed by the second client 12b. The above technique is advantageous in that the system 10 does not need to store multiple copies of the same LOB file for different clients 12. Alternatively, if the de-duplication flag 310 is set to "OFF," the de-duplication module 22 then stores the LOB file data transmitted by client 12b at another physical storage location (FIG. 5B), which in the example, is "B1."

Assuming, in the example, that client 12b now wishes to access the LOB data for LOB file named "ABC." The client 12b sends a request to the system 10 to access the data for LOB file "ABC." Upon receiving the request, the system 10 checks the list of LOB identifiers (e.g., from table 300) to see if the LOB identifier "ABC" can be found. As shown in FIG. 5A, the LOB file identifier "ABC" can be found in the table 300, and has an address value of "A1," which is the same address for the LOB file data stored for client 12a. The system 10 uses the address "A1" to retrieve the LOB file data requested by the client 12b, and transmits the LOB file data to the client 12b.

Following the above example, assuming that client 12a now sends a request to the system 10 requesting that the LOB file "XYZ" be deleted from the database 14. Upon receiving the request, the system 10 checks the list of LOB identifiers (e.g., from table 300) to see if the LOB identifier "XYZ" can be found. As shown in FIG. 5A, the LOB file identifier "XYZ" can be found in the table 300, and has a counter value of "2." The de-duplication module 22 then updates the counter from "2" to "1" and remove the LOB identifier "XYZ," thereby "deleting" the LOB file "XYZ" without actually deleting the LOB file data (FIG. 6). As long as the counter value is larger than zero, indicating that the stored LOB file data needs to be preserved for at least one client (which in the example is client 12b), the actual LOB file data would not be deleted from the system 10.

Following the above example, assuming that client 12b now sends a request to the system 10 requesting that the LOB file "ABC" be deleted from the database 14. Upon receiving the request, the system 10 checks the list of LOB identifiers (e.g., from table 300) to see if the LOB identifier "ABC" can be found. As shown in FIG. 6, the LOB file identifier "ABC" can be found in the table 300, and has a counter value of "1." The de-duplication module 22 then updates the counter from "1" to "0." Upon detecting that the counter is now equal to "0" (representing the fact that there is no remaining client 12 that whishes the LOB file data be stored), the de-duplication module 22 deletes the LOB file data in the database 14, thereby releasing the storage space for other purposes. In some embodiments, upon detecting that the counter 308 is "0," the de-duplication module 22 does not delete the LOB file data immediately, but wait for a certain prescribed period (e.g., 3 months, 1 week, several days, etc.) before deleting the LOB file data from the database 14. This allows the client 12 to undo the delete operation in the event that the client 12 changes its mind within the prescribed period.

In other embodiments, the counter 308 can be used for other purposes. For example, in some embodiments, instead of, or in addition to, using the counter 308 to determine when to release storage space, the counter 308 can be used to determine when to start a new index. For example, in the embodiments of FIG. 4B, the LOB files 50 associated with index "16" are considered to be in a group. However, in some cases, if the number of LOB files 50 becomes too big in a group, it may take the system 10 to long to process data in the group. As such, it may be desirable to limit the number of LOB files 50 that in a group. For example, an upper counter limit, e.g., 100, may be prescribed by an administrator. In such cases, if the counter 308 is equal to or exceeds 100, a new index may be provided to start a new group. The new index would have a counter that starts from "1" and is associated with the same hash value ("H3" in the example).

In further embodiments, the counter 308 can be used to indicate that a client 12 has requested one or more copies of the file be made. For example, assuming that the system 10 already stores a LOB file 50 having a hash value "H3," which corresponds to a request to store the file "XYZ" from client 12a and a request to store the file "ABC" from client 12b (i.e., the files "XYZ" and "ABC" have the same data and therefore, the same hash value). If the client 12a sends a request to make a copy of the LOB file "XYZ" in the database 14, the system 10 can satisfy such request by updating the counter 308 for the LOB file "XYZ" by one (e.g., from "1" to "2"). As such, the system 10 satisfies the request without explicitly making and storing a copy of the stored LOB file 50. In such cases, the metadata may include a plurality of counter values 308 for the LOB file 50, wherein each counter value 308 is associated with a LOB file identifier (e.g., "XYZ," "ABC," etc.). In the above example, the counter value 308 for the LOB file 50 "XYZ" has been updated from "1" to "2," and the counter value 308 for the LOB file 50 "ABC" remains as "1." As such, the total counter value for the file associated with hash value "H3" is "3," indicating that there have been three requests to store the same file data (two requests from client 12a, and one request from client 12b).

As another example, assuming that the following is stored in the system 10:

| Hash Val | LOB ID | Dedup Flag | Count | StorageAddr |
| --- | --- | --- | --- | --- |
| H3 | XYZ, ABC | ON | 2 | A1 |
| H4 | XYZ1, ABC1 | ON | 2 | A2 |

If the client wishes to copy the data from XYZ to XYZ1 (that is, XYZ1 is the destination of the copy, and is to have the same data as XYZ), then the diagram becomes

| Hash Val | LOB ID | Dedup Flag | Count | StorageAddr |
| --- | --- | --- | --- | --- |
| H3 | XYZ, ABC, XYZ1 | ON | 3 | A1 |
| H4 | ABC1 | ON | 1 | A2 |

As shown in the example, the counter value 308 has been decremented for hash value H4, and incremented for hash value H3

In the above embodiments, the LOB file data is associated with a single address (e.g., "A1" in the example). However, in any of the embodiments described herein, the LOB file data may be associated with more than one address. For example, in other embodiments, each block 52 of the LOB file 50 may have an associated address. FIG. 7 illustrates an example in which the LOB file 50 is separated into five blocks (such as blocks 52a-52e shown in FIG. 2). Blocks 52a-52e have block identifiers "B1"-"B5," respectively. The sizes of blocks 52a-52e are 250 kb, 250 kb, 248 kb, 252 kb, and 30 kb, respectively. Also, in the illustrated example, blocks 52a-52e are stored in addresses "A1"-"A5," respectively. Assuming that the client 12a sends a request to the system 10 to access a portion of the saved LOB file 50 (e.g., data from 260 kb to 800 kb).

The system 10 then looks up the table 300, and based on the sizes of the blocks, determines that the requested data can be obtained from blocks B2-B4. In response to the client's 12a request, the system 10 then retrieves the data that correspond to blocks B2-B4 using addresses A2-A4, respectively, and transmits the data to the client 12a. Such technique is advantageous in that the system 10 needs not process the entire LOB file 50 in order to allow the client 12 to access a portion of the LOB file 50. In particular, since the system 10 can retrieve the requested data by accessing only the block(s) 52 that contains the requested data (individually accessing the block(s) 52), the system 10 can provide the client 12 access to any one of the blocks 52 without having to access the entire LOB file 50 that contains all the file data.

In any of the embodiments described herein, the database 14 can be one or a combination of storage devices that can store data. For example, the database 14 can be a single storage device that is configured to store various information described herein. In some cases, the storage device may be partitioned into a plurality of sub-storage devices, thereby allowing different information to be organized and maintained. In other examples, the database 14 can include two or more storage devices that are communicatively coupled (e.g., through internet or cable(s)) to each other. In such cases, the storage devices are configured to store different information described herein. In some embodiments, one or more of the storage devices may be partitioned to form a plurality of sub-storage devices.

Also, in other embodiments, the metadata described herein need not be stored in the database 14 according to the examples of the format shown previously. For example, in other embodiments, the metadata described herein may be stored in one or more tables. If a plurality of tables are used, one or more data from one table may be associated with one or more data from another table (e.g., using a common variable or a pointer). In further embodiments, the metadata described herein need not be stored in table format, and may be stored in the database 14 in other forms that are known in the art.

Data Compression

Figure 8:
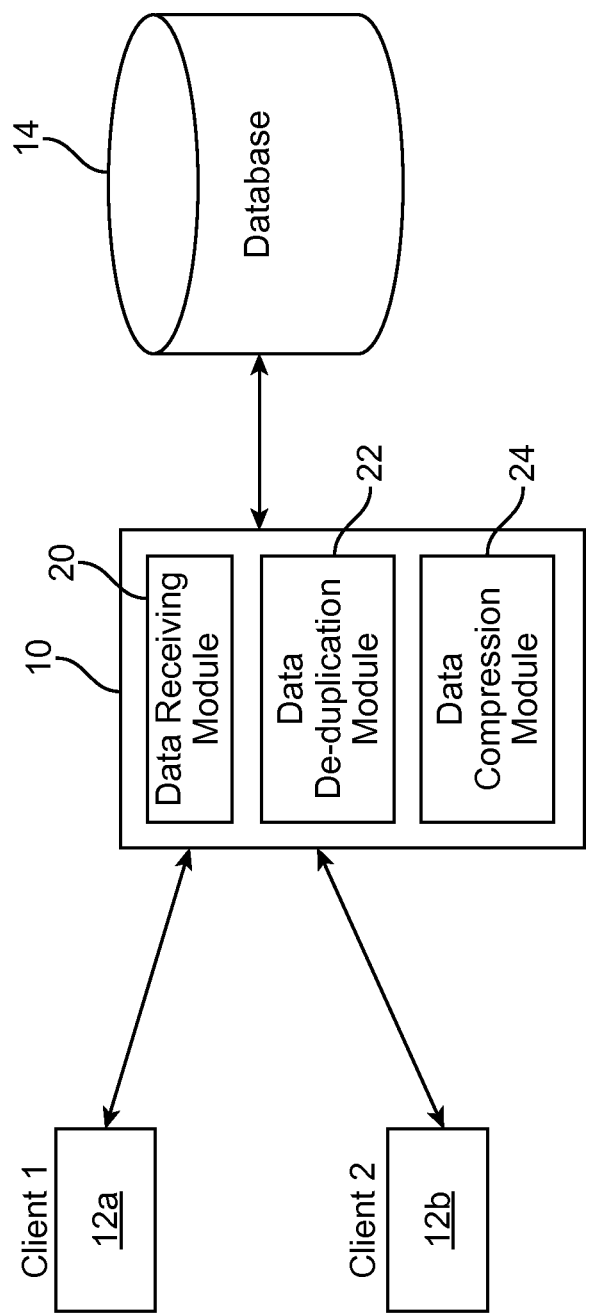
FIG. 8 illustrates a system having a data compression module in accordance with some embodiments.

In some embodiments, the system 10 may further include a data compression module 24 (FIG. 8). The data compression module 24 is configured to compress data before the data is stored at the system 10. The data compression module 24 may also be configured to de-compress data in response to a client's request to retrieve/access the stored data.

Figure 9:
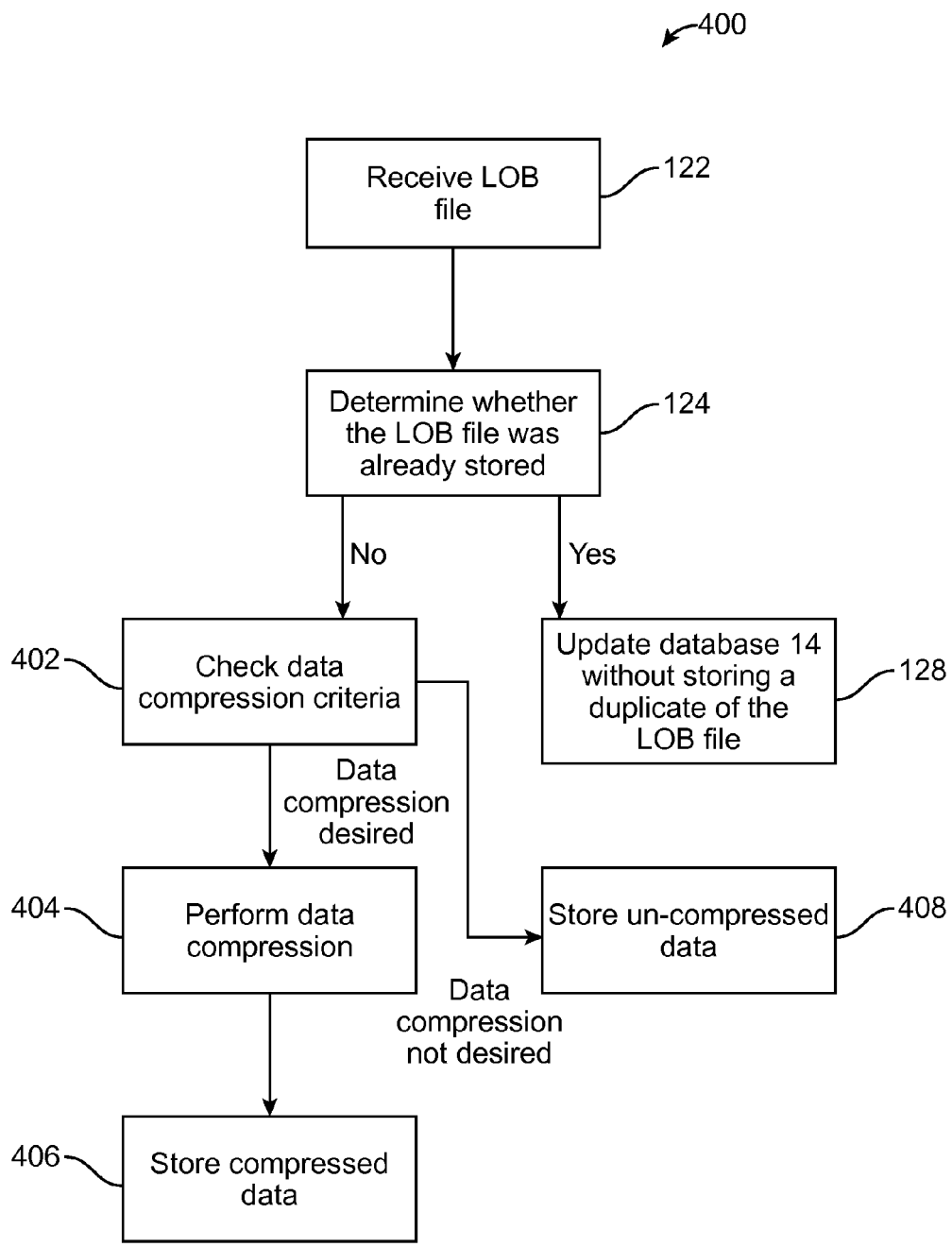
FIG. 9 illustrates a process performed by the data compression module of FIG. 8 in accordance with some embodiments.

FIG. 9 illustrates a process 400 that includes data compression performed by the data compression module 24 in accordance with some embodiments. As shown in the figure, the de-duplication module 22 receives the LOB file 50 (Step 122), and determines whether the LOB file 50 was already stored (Step 124). If the LOB file 50 was already stored, then the system 10 updates the database 14 without storing a duplicate of the LOB file 50 (Step 128). On the other hand, if the de-duplication module 22 determines that the LOB file 50 is not yet stored, the de-duplication module 22 then passes the LOB file data to the data compression module 24.

Upon detecting that there is a LOB file that is desired to be stored at the system 10, the data compression module 24 first checks data compression criteria (Step 402). The data compression criteria prescribes whether and/or how to perform data compression for the LOB file data based on certain rules set by a user. In the illustrated embodiments, the system 10 may include a user interface that allows a user, such as an administrator, to input the data compression criteria. For example, an administrator may prescribe one of four levels of compression, namely, "None," "Low," "Medium," and "High" for a certain type or/and size of file. "None" compression is prescribed when no compression is desired to be performed for the file. "Low" compression is prescribed when some compression is desired. "High" compression is prescribed when significant compression is desired. In some cases, the user may, for example, prescribe a file size limit as a data compression criteria. In such cases, if the LOB file size is below the prescribed file size, the data compression module 24 may then perform a "Low" level of data compression, or may not perform any data compression at all. The user may, as another example, prescribe a file type and assign a certain level (e.g., "Medium") of compression for such file type. For example, the user may prescribe all ".gif" file type be compressed at "Medium" level of compression. In other embodiments, the user interface may also allow the user to prescribe which data compression algorithm (which may or may not corresponds to a desired level of compression) to use for certain file based on the file type and/or file size. In other examples, the user may input a source address for which data compression is desired. In such case, if the system 10 receives data from the prescribed source address, the system 10 then performs data compression. The user may also prescribe which compression algorithm to use for data coming from certain prescribed source address. In other embodiments, the data compression criteria may be determined by the client 12 transmitting the LOB file 50. For example, the client 12 may transmit the LOB file 50 to the system 10, and requesting the system 10 to store the file 50 in a compressed form. In such cases, the system 10 determines that data compression is desired if it receives a request from the client 12 to compress the LOB file 50.

In further embodiments, the data compression module 24 may be configured to determine compression efficiency on at least a portion of the LOB file, and automatically determines a level of data compression for the LOB file. For example, if the data compression module 24 determines that the compression efficiency is low (e.g., below a prescribed limit), the data compression module 24 may not perform any data compression for the LOB file. On the other hand, if the data compression module 24 determines that the compression efficiency is high (e.g., above a prescribed limit), the data compression module 24 may perform a "High" level of data compression for the LOB file.

Returning to FIG. 9, next, the data compression module 24 compresses the LOB file data based on the compression criteria obtained from Step 402 (Step 404), and then stores the compressed LOB file data in the database 14 (Step 406). In some cases, if it is determined by the data compression module 24, based on the data compression criteria, that the received LOB file data is not to be compressed, the data compression module 24 then stores the LOB file data in uncompressed form at database 14 (Step 408). The storing of the LOB file may be performed based on a data collection threshold, as similarly discussed herein.

Figure 10:
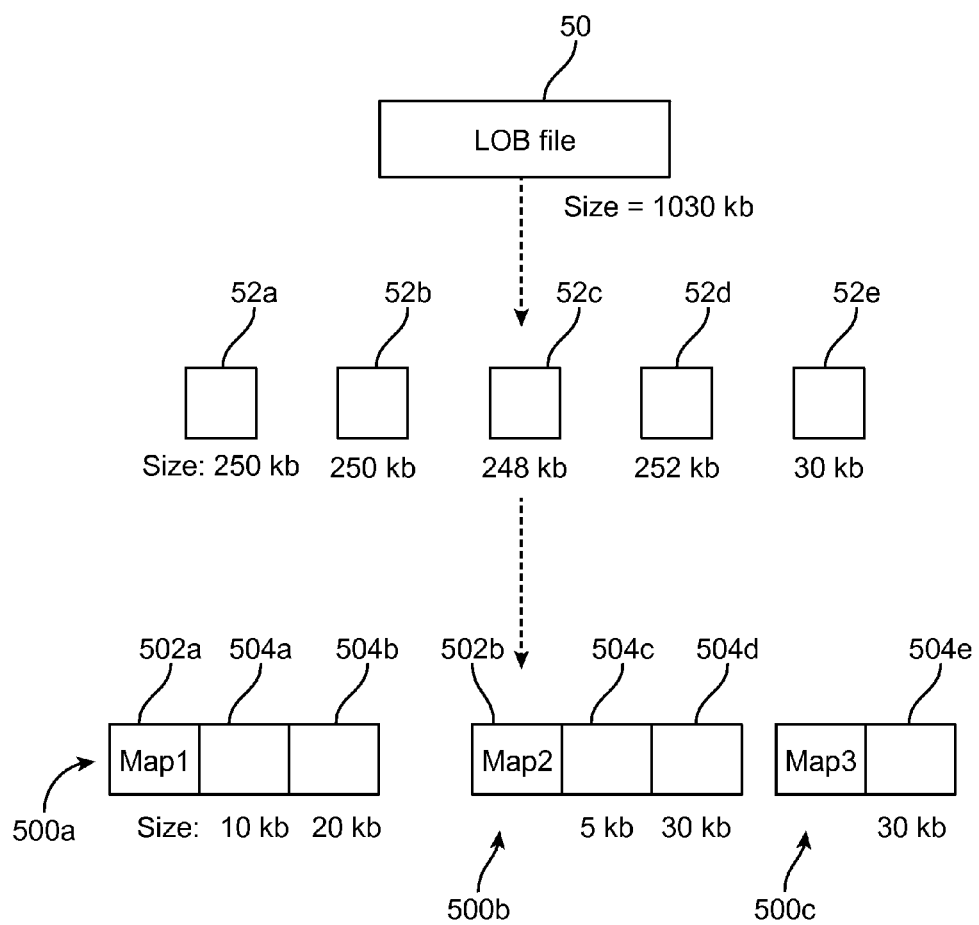
FIG. 10 illustrates compression units having sub-units in accordance with some embodiments.

In the illustrated embodiments, the data compression module 24 is configured to create one or more compression unit for the LOB file 50. FIG. 10 illustrates an example of a LOB file 50, which is separated into blocks 52a-52e by the data receiving module 20. In the illustrated examples, blocks 52a-52e have data sizes 250 kb, 250 kb, 248 kb, 252 kb, and 30 kb, respectively. The data compression module 24 then creates three compression units 500a-500c, wherein each compression unit 500 corresponds to one or more blocks 52 having a total size that is less than (or equal to) a prescribed unit size. In the illustrated example, the prescribed unit size is 500 kb, which may be input by a user, such as an administrator. As a result, each compression unit 500 includes compressed data that correspond to uncompressed block(s) 52 having a total size that is 500 kb or less. In other embodiments, the uncompressed total size associated with a compression unit 500 can exceed the prescribed threshold. For example, in some cases, the system 10 may be configured to create a compression unit 500 when the total uncompressed data received exceeds the prescribed threshold (500 kb in the example).

As shown in the figure, compression unit 500a includes a data compression map 502a, a sub-unit 504a that corresponds to the block 52a, and a sub-unit 504b that corresponds to the block 52b. In particular, the sub-unit 504a is the compressed data of block 52a, and the sub-unit 504b is the compressed data of block 52b. The data compression map 502a is a variable-sized map for the compression unit 500a, which tracks the physical length and logical length of the sub-units 504a, 504b. Similarly, compression unit 500b includes a data compression map 502b, a sub-unit 504c that corresponds to the block 52c, and a sub-unit 504d that corresponds to the block 52d, and compression unit 500c includes a compression map 502c and a sub-unit 504e that corresponds to the block 52e. As shown in the illustrated example, compression unit 500a corresponds to blocks 52a, 52b having a total size of 500 kb (which is equal to the prescribed unit size of 500 kb), compression unit 500b corresponds to blocks 52c, 52d having a total size of 500 kb (which is equal to the prescribed unit size of 500 kb), and compression unit 500*c* corresponds to block 52*e* having a total size of 30 kb (which is less than the prescribed unit size of 500 kb).

Figure 11A:
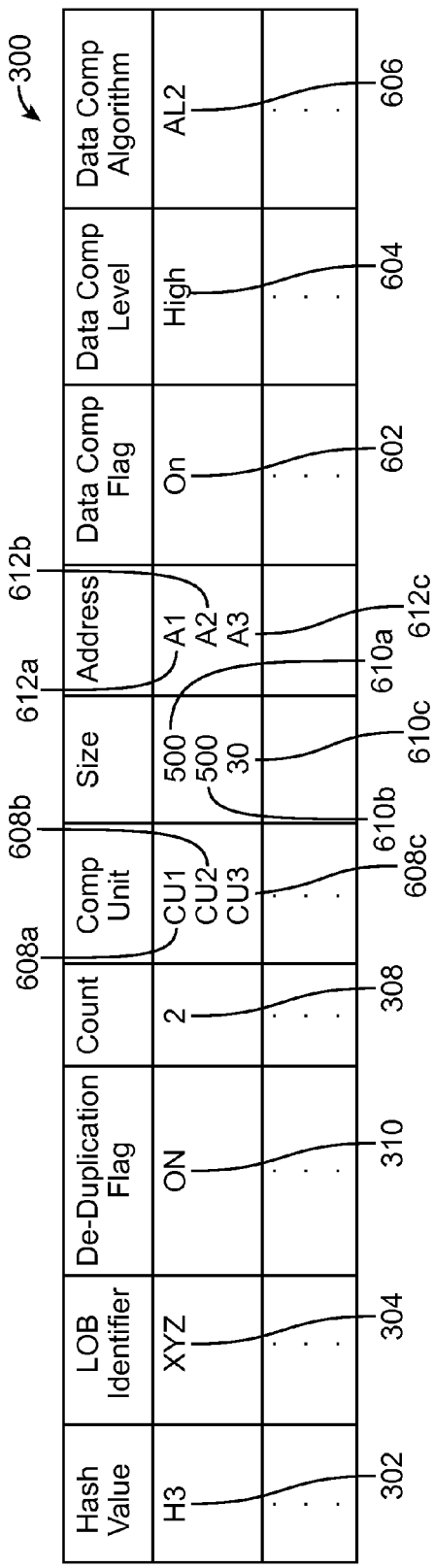
FIG. 11A illustrates metadata of a stored file in accordance with some embodiments, particularly showing metadata having information regarding data compression.

FIG. 11A illustrates a table 300 of metadata for the LOB file 50 that may be stored in the database 14 after the LOB file data have been processed by the data compression module 24. As shown in the figure, the metadata includes the final calculated hash value 302 that uniquely identifies the LOB file 50, an identifier 304 of the LOB file 50, a counter 308, and a de-duplication flag 310. The hash value 302, identifier 304, counter 308, and the de-duplication flag 310 are similar to those discussed with reference to FIG. 4A. In the illustrated example, the metadata also includes a data compression flag 602, a data compression level 604, a data compression algorithm identifier 606. The data compression flag 602 is "ON," indicating that the stored LOB file data has been compressed. The data compression level in the example is "High," indicating that a high level of data compression is desired for the LOB file data. The data compression algorithm identifier 606 indicates that data compression algorithm "AL2" is used to perform data compression for the LOB file 50. Alternatively, the data compression flag 602 may be "OFF," indicating that no data compression for the LOB file 50 has been performed. In other embodiments, the metadata stored in the database 14 may not include one or some of the ones discussed. For example, in other embodiments, the metadata may not include the data compression algorithm identifier 606.

In the illustrated example, the metadata also includes compressed unit identifiers 608*a*-608*c* that are identifiers of compressed units 500*a*-500*c*, respectively. The identifiers 608*a*-608*c* have respective values "CU1," "CU2," and "CU3." The metadata also includes the size 610 of the portion of the LOB file 50 that corresponds with each respective compressed unit 500. In the illustrated example, the size 610*a* of the portion of the LOB file 50 associated with the compressed unit 500*a* is 500 kb, the size 610*b* of the portion of the LOB file 50 associated with the compressed unit 500*b* is 500 kb, and the size 610*c* of the portion of the LOB file 50 associated with the compressed unit 500*c* is 30 kb. In the illustrated example, the metadata further includes addresses 612*a*-612*c* that represent the physical storage location associated with the respective compressed units 500*a*-500*c*. In some embodiments, the addresses 612 may be implemented using pointers.

FIG. 12 illustrates an example of the data compression maps 502*a*-502*c*. The data compression map 502*a* includes block identifiers 650*a*, 650*b*, the block sizes 652*a*, 652*b* for blocks 52*a*, 52*b*, respectively, and sub-unit sizes 654*a*, 654*b*, for sub-units 504*a*, 504*b*, respectively. The data compression map 502*a* also includes sub-unit addresses 656*a*, 656*b* for the sub-units 504*a*, 504*b*, respectively. The data compression map 502*b* includes block identifiers 650*c*, 650*d*, the block sizes 652*c*, 652*d*, for blocks 52*c*, 52*d*, respectively, and sub-unit sizes 654*c*, 654*d*, for sub-units 504*c*, 504*d*, respectively. The data compression map 502*b* also includes sub-unit addresses 656*c*, 656*d* for the sub-units 504*c*, 504*d*, respectively. The data compression map 502*c* includes block identifier 650*e*, the block size 652*e* for block 52*e*, and sub-unit size 654*e* for the sub-unit 504*e*. The data compression map 502*c* also includes sub-unit address 656*e* for the sub-unit 504*e*.

Assuming that the client 12*a* wishes to access a portion of the LOB file 50 "XYZ," wherein the portion is from the 260th kb to the 750th kb of the LOB file 50. The client 12*a* sends a request to the system 10, which looks up the metadata for the LOB file 50 "XYZ." Based on the block sizes 610*a*, 610*b*, from table 300, which cover the range of data requested by the client 12*a*, the system 10 determines that the requested portion of the LOB file 50 can be obtained by accessing compression units 500*a* "CU1," and compression unit 500*b* "CU2." The system 10 then accesses the compression maps 502*a*, 502*b* of the compression units 500*a*, 500*b*. From the compression maps 502*a*, the system 10 determines that the first block 52*a* "B1" does not contain any requested data because it only covers data from 0 kb to 250 kb, and that the second block 52*b* "B2" contains at least a portion of the requested data because it covers data from 251 kb to 500 kb. Using the address 656*b* "SUA2" for the second sub-unit 504*b*, the system 10 then retrieves the compressed data for the second sub-unit 504*b*. The system 10 then de-compresses the data (having a size of 20 kb) from the sub-unit 504*b* to obtain the uncompressed data (having a size of 250 kb), and transmits it to the client 12*a*.

In the example, since sub-unit 504*b* only provides data up to the 500th kb, in order to provide the remaining requested data (the 501st kb to the 750th kb) to the client 12*a*, the system 10 accesses the next data compression map 502*b*. According to the compression map 502*b*, the next sub-unit 504*c* can provide the 501st kb to the 748th kb. As such, the system 10 uses the sub-unit address 656*c* to retrieve the compressed data for the sub-unit 504*c*. The system 10 then de-compresses the data (having a size of 5 kb) from the sub-unit 504*c* to obtain the uncompressed data (having a size of 248 kb), and transmits it to the client 12*a*.

In the example, since sub-units 504*a*, 504*b* only provide data up to the 748th kb, in order to provide the remaining requested data (the 749th kb to the 750th kb) to the client 12*a*, the system 10 accesses the next sub-unit 504*d*. According to the compression map 502*b*, the next sub-unit 504*d* can provide the 749th kb to the 750th kb. As such, the system 10 uses the sub-unit address 656*d* to retrieve the compressed data for the sub-unit 504*d*. The system 10 then de-compresses the data (having a size of 30 kb) from the sub-unit 504*d* to obtain the uncompressed data (having a size of 252 kb), and transmits it to the client 12*a*.

As shown in the above embodiments, the system 10 is configured to perform two mappings, i.e., mapping the sub-units 504 with their respective blocks 52 (logical mapping), and mapping the sub-units 504 with their respective addresses 656 (physical mapping). Such technique is advantageous in that it allows the client 12 to access a portion of the LOB file 50 without having to process (e.g., perform data de-compression) on the entire LOB file 50.

Figure 11B:
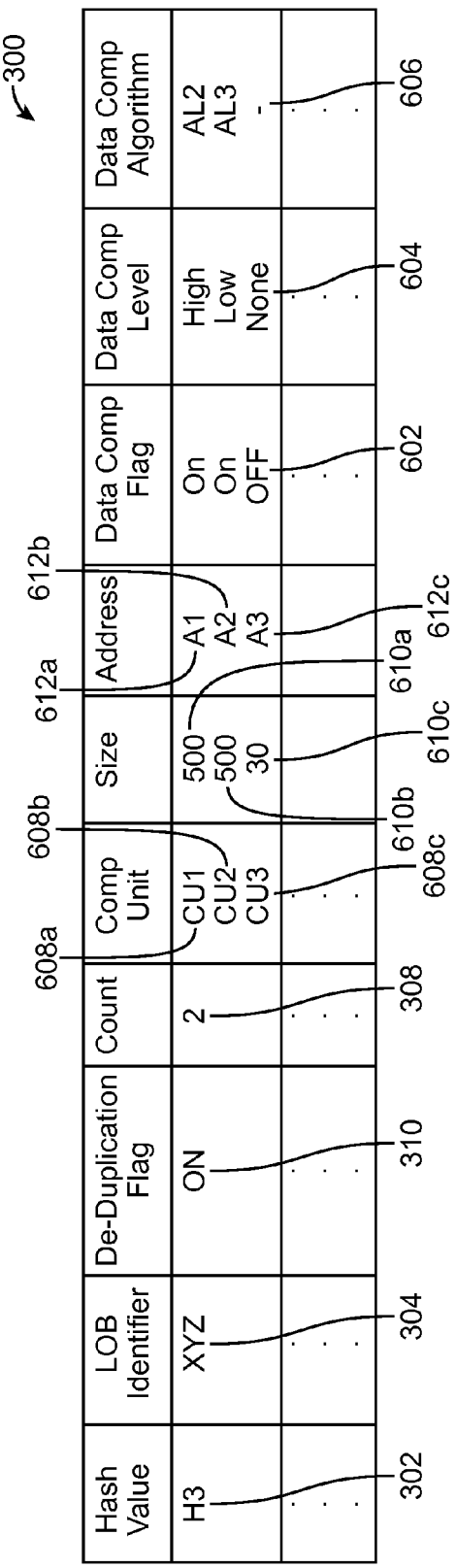
FIG. 11B illustrates metadata of a stored file in accordance with other embodiments, particularly showing blocks of the file having their respective data compression information.

In the above embodiments, different blocks 52 of the same LOB file 50 have the same data compression criteria. In other embodiments, different blocks 52 of the same LOB file 50 may have different compression requirements (e.g., compression levels, compression algorithms, etc.). FIG. 11B illustrates a variation of the metadata stored in the database 14, wherein different compression requirements are prescribed for different blocks 52 of the LOB file 50 "XYZ." In the example, compression unit 500*a* "CU1" is obtained using compression algorithm "AL2" which provides "High" level of data compression for the corresponding block 52*a*. Compression unit 500*b* "CU2" is obtained using compression algorithm "AL3" which provides "Low" level of data compression for the corresponding block 52*b*. The compression flag for compression unit 500*c* "CU3" is set to "OFF," indicating that the data in the compression unit 500*c* are not compressed. As shown in the figure, the compression level for the compression unit 500*c* is set to "None," and no data compression algorithm is designated. In other embodiments, in addition to compression algorithm(s), the table 300 or the data compression map(s) 502 may also include information regarding which algorithm(s) to use for compressing and/or de-compressing data from different sub-unit(s) 504.

In the above embodiments, different sub-units 504 associated with same compression unit 500 may use different compression algorithms and de-compression algorithms. In other embodiments, different sub-units 504 associated with the same compression unit 500 may use the same compression algorithm and de-compression algorithm, but sub-units 504 from different compression units 500 may use different compression algorithms and de-decompression algorithms.

Figure 13:
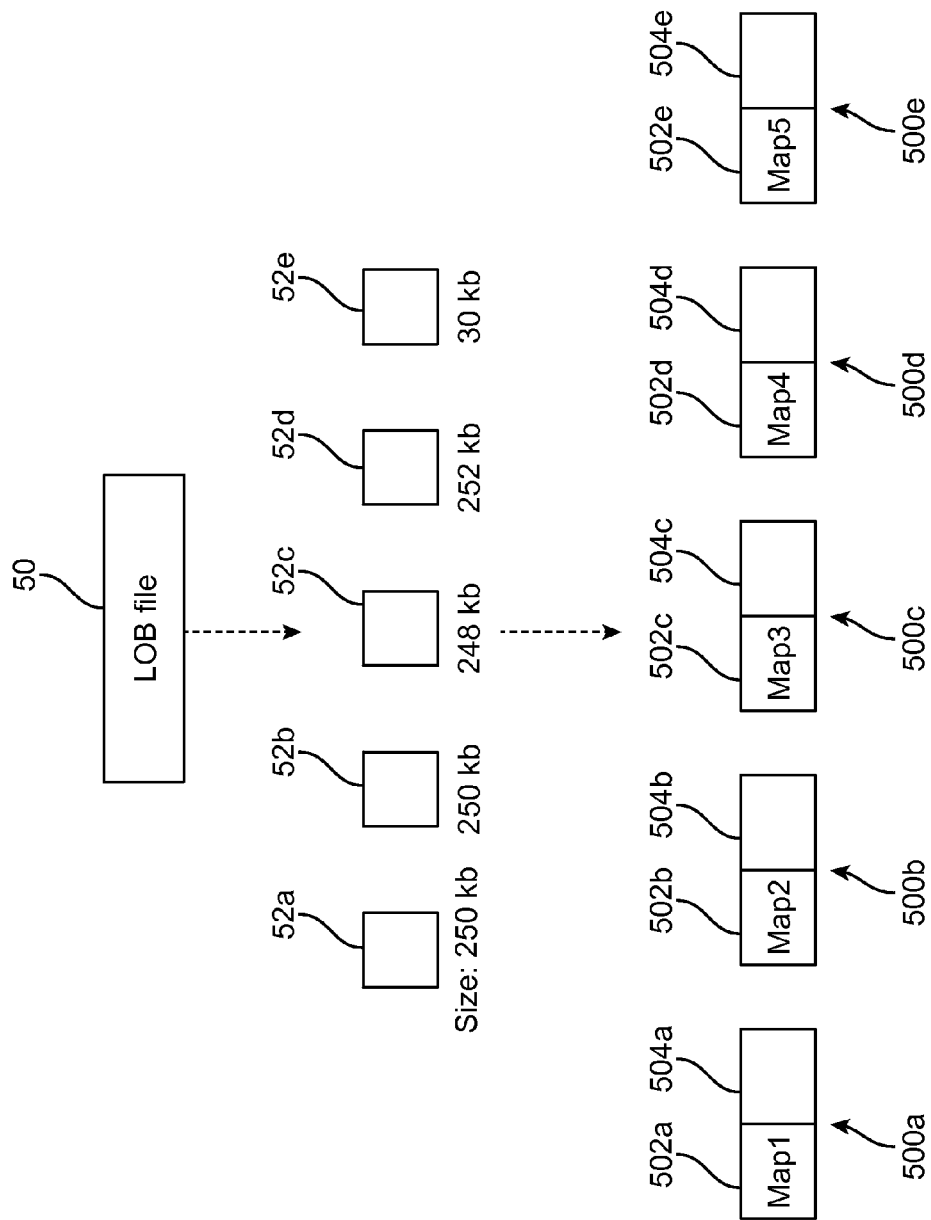
FIG. 13 illustrates compression units in accordance with other embodiments.

In the above embodiments, a compression unit 500 may correspond to a plurality of blocks 52 from the LOB file 50. This is because the prescribed processing threshold (which is 260 kb in the above example) used by the data receiving module 20 to determine a size of a block 52, is different from the prescribed unit size (which is 500 kb in the above example) used by the data compression module 24 to determine how many block(s) 52 is covered by a compression unit 500. In other embodiments, each compression unit 500 may correspond to a single block 52. FIG. 13 illustrates an alternative embodiment in which each block 52 from the LOB file 50 is compressed to form a single compression unit 500. In the illustrated example, the LOB file 50 is separated by the data receiving module 22, based on the prescribed processing threshold, into five blocks 52*a*-52*e*. The data compression module 24 then performs data compression to create compression units 500*a*-500*e* for blocks 52*a*-52*e*, respectively.

In the above embodiments, the data compression module 24 is configured to store the LOB file 50 in the form of a plurality of compression units 500, such that the client 12 can perform random access of a portion of the LOB file 50. However, in other embodiments, the system 10 may not provide such feature. In such cases, the data compression module 24 may receive the LOB file 50 and then perform data compression to create a single compressed file for the LOB file 50.

As described in the above embodiments, the system 10 of FIG. 8 includes both the de-duplication module 22 and the data compression module 24. However, in other embodiments, the system 10 may not include the data de-duplication module 22. In such cases, the data compression module 24 is not configured to receive LOB file data from the de-duplication module 22, but from the data receiving module 20. In some embodiments, if the system 10 does not include the de-duplication module 22, each LOB file that is requested by a client 12 to be stored at the system 10 is compressed by the data compression module 24, and is then stored at a physical storage unit, without accounting for the possibility that the LOB file may be a duplicate of an already stored file. In other embodiments, duplication of data may be detected by another system (e.g., by the client 12, or by another processing unit coupled to the system 10). In such cases, the data compression module 22 will compress LOB file data that is not already stored at the database 14.

In any of the embodiments described herein, the system 10 may be configured to allow a data processing threshold to be inputted (e.g., via a user interface) for the data compression module 24. The data processing threshold for the data compression module 24 is the prescribed size of a portion of the LOB file 50 to be processed by the data compression module 24. For example, the data compression module 24 may be configured to keep track a size of the portion of the LOB file that has been processed by the data de-duplication module 22. When the size reaches or exceeds the prescribed data processing threshold for the data compression module 24, the data compression module 24 then performs the various functions associated with data compression described herein. The data processing threshold for the data compression module 24 may be the same as, or different from, that for the data de-duplication module 22.

Data Encryption

Figure 14:
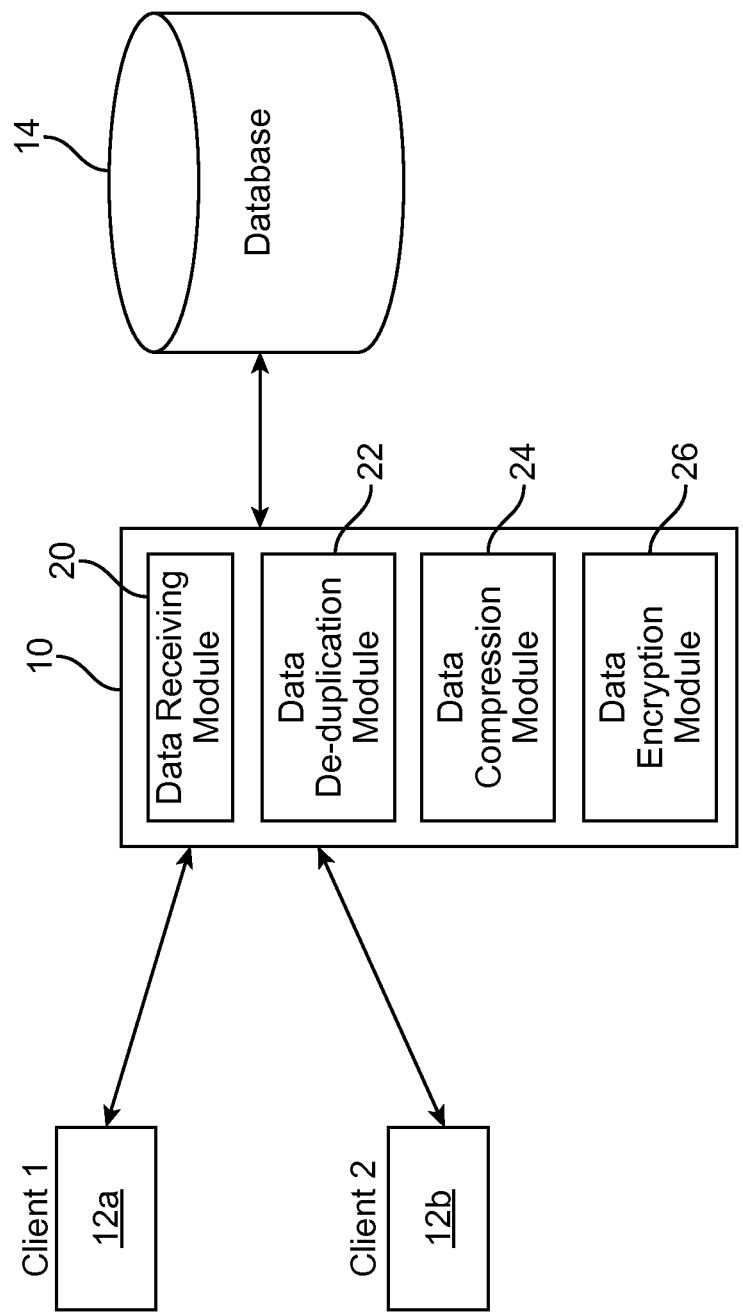
FIG. 14 illustrates a system having a data encryption module in accordance with some embodiments.

In some embodiments, the system 10 may further include a data encryption module 26 (FIG. 14). The data compression module 26 is configured to encrypt data before the data is stored at the system 10. The data encryption module 26 may also be configured to decrypt data in response to a client's request to retrieve/access the stored data.

Figure 15:
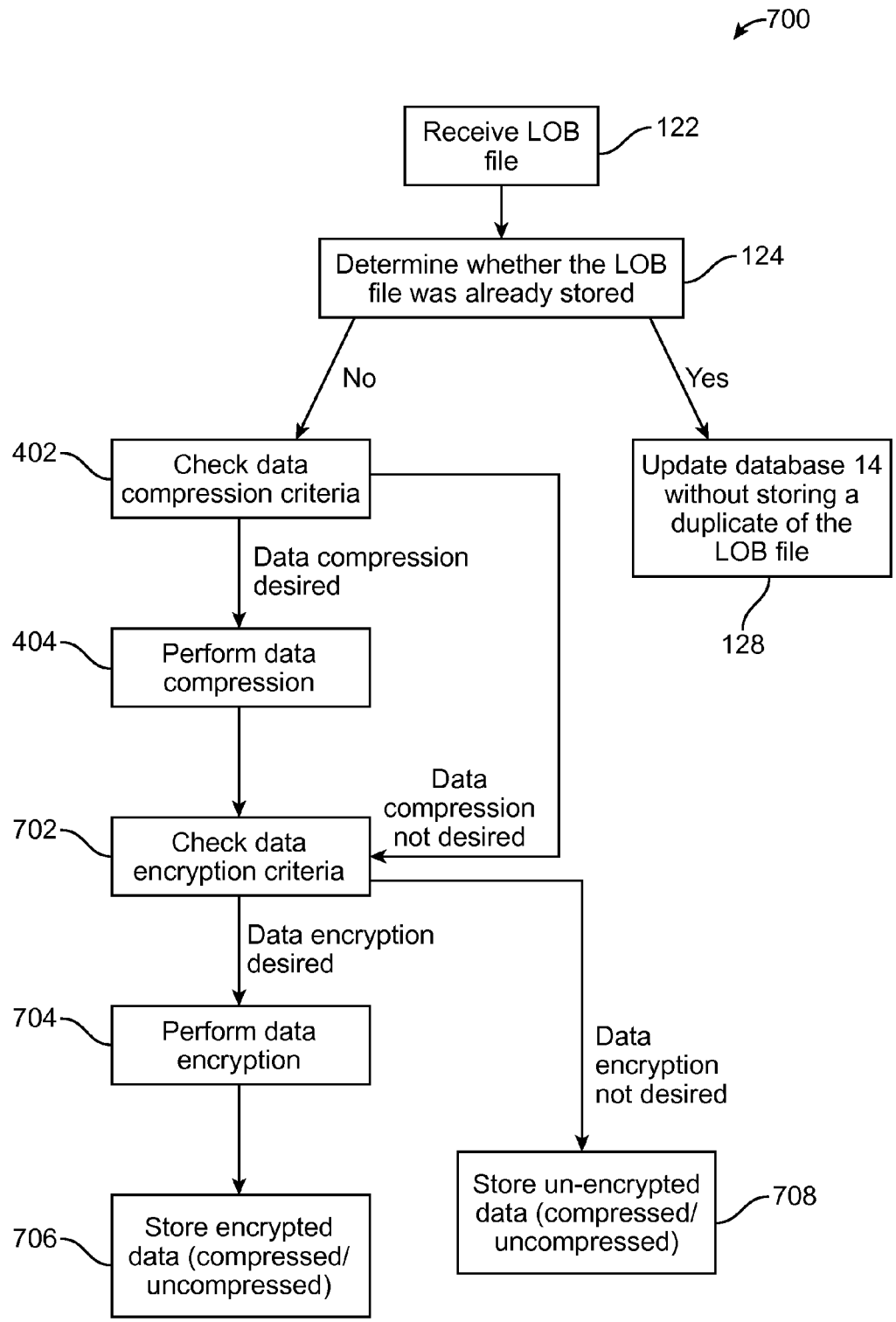
FIG. 15 illustrates a process performed by the data encryption module of FIG. 14 in accordance with some embodiments.

FIG. 15 illustrates a process 700 that includes data encryption performed by the data encryption module 26 in accordance with some embodiments. As shown in the figure, the de-duplication module 22 receives the LOB file 50 (Step 122), and determines whether the LOB file 50 was already stored (Step 124). If the LOB file 50 was already stored, then the system 10 updates the database 14 without storing a duplicate of the LOB file 50 (Step 128). On the other hand, if the de-duplication module 22 determines that the LOB file 50 is not yet stored, the de-duplication module 22 then passes the LOB file data to the data compression module 24, which performs data compression (Step 404), as described previously.

After the LOB file data has been compressed, the LOB file data is then passed to the encryption module 26. The data encryption module 26 first checks data encryption criteria (Step 702). The data encryption criteria prescribes whether and/or how to perform data encryption for the LOB file data based on certain rules set by a user. In the illustrated embodiments, the system 10 may include a user interface that allows a user, such as an administrator, to input the data encryption criteria. For example, the user may input certain file type(s) for which data encryption is desired. The user may also prescribe which encryption algorithm to use for certain file type. In other examples, the user may input a source address for which data encryption is desired. In such case, if the system 10 receives data from the prescribed source address, the system 10 then performs data encryption. The user may also prescribe which encryption algorithm to use for data coming from certain prescribed source address. In other embodiments, the data encryption criteria may be determined by the client 12 transmitting the LOB file 50. For example, the client 12 may transmit the LOB file 50 to the system 10, and requesting the system 10 to store the file 50 in an encrypted form. In such cases, the system 10 determines that data encryption is desired if it receives a request from the client 12 to encrypt the LOB file 50.

If the data encryption module 26 determines, based on the data encryption criteria, that the LOB file 50 is not to be encrypted, the data encryption module 26 then passes the LOB file 50 to be stored in the database 14 (Step 708). The storing of the LOB file may be performed based on a data collection threshold, as similarly discussed herein.

On the other hand, if the data encryption criteria indicates that the LOB file 50 needs to be encrypted, the data encryption module 26 then performs data encryption for the LOB file 50 (Step 704), and passes the encrypted LOB file 50 downstream to be stored at the database 14 (Step 706). In some embodiments, the LOB file 50 is transmitted to the data encryption module 26 in the form of blocks 52, as described previously. The blocks 52 may be compressed if the system 10 includes the data compression module 24. In other embodiments, the blocks 52 may be uncompressed if the system 10 does not include the data compression module 24, or if the blocks 52 are not prescribed to be compressed based on the prescribed compression criteria. If the LOB file 50 is passed to the data encryption module 26 in the form of blocks

52, the data encryption module 26 then performs data encryption for the LOB file 50 on a block-by-block basis to create a plurality of encrypted blocks. Alternatively, the LOB file 50 may be passed to the data encryption module 26 as a single file. In such cases, the data encryption module 26 performs data encryption for the LOB file 50 to create a single encrypted LOB file.

Various techniques may be used by the data encryption module 26 to perform data encryption. In the illustrated embodiments, upon determining that the LOB file 50, or a block of the LOB file 50, needs to be encrypted, the data encryption module 26 obtains an encryption key from a database. The database providing the encryption key may be another database (not shown) or the database 14. The data encryption module 26 then encrypts the LOB file 50 or the block(s) of the LOB file 50 using a prescribed encryption algorithm and the encryption key. In some embodiments, the encryption algorithm used is based on a type of the LOB file 50. For example, an administrator may prescribe that encryption algorithm "EA2" be used by the data encryption module 26 to encrypt ".gif" file.

In the above embodiments, the data encryption is performed after the data compression. In other embodiments, instead of performing data encryption (Step 704) after data compression (Step 404), the system 10 may be configured to perform data compression (Step 404) after data encryption (Step 704).

FIG. 16A illustrates a table 300 of metadata for the LOB file 50 that may be stored in the database 14 after the LOB file data have been processed by the data encryption module 26. The metadata are similar to those discussed with reference to FIG. 11A, except that the metadata of FIG. 16A also includes an encryption flag 800 and an encryption key address 802. In the illustrated example, the encryption flag 800 is set to "ON," indicating that the compression units "CU1," "CU2," and "CU3" are encrypted. The encryption key address 802 indicates the location at which the encryption key can be obtained. In some embodiments, the encryption key address 802 may be implemented using a pointer.

Assuming again, that the client 12a wishes to access a portion of the LOB file 50 "XYZ," wherein the portion is from the 260th kb to the 750th kb of the LOB file 50. The client 12a sends a request to the system 10, which looks up the metadata for the LOB file 50 "XYZ." Based on the encrypted block sizes 610a, 610b, from table 300, which cover the range of data requested by the client 12a, the system 10 determines that the requested portion of the LOB file 50 can be obtained by accessing encrypted compression units 500a "CU1," and encrypted compression unit 500b "CU2." The system 10 then accesses the compression maps 502a, 502b of the encrypted compression units 500a, 500b. From the compression maps 502a, the system 10 determines that the first block 52a "B1" does not contain any requested data because it only covers data from 0 kb to 250 kb, and that the second block 52b "B2" contains at least a portion of the requested data because it covers data from 251 kb to 500 kb. Using the address 656b "SUA2" for the second sub-unit 504b, the system 10 then retrieves the encrypted compressed data for the second sub-unit 504b. The system 10 then obtains the encryption key using the encryption key address 802, and uses the encryption key to decrypt the data from sub-unit 504b. After the data from the sub-unit 504b is decrypted, the system 10 then de-compresses the data (having a size of 20 kb) from the sub-unit 504b to obtain the uncompressed data (having a size of 250 kb), and transmits it to the client 12a.

In the example, since sub-unit 504b only provides data up to the 500th kb, in order to provide the remaining requested data (the 501st kb to the 750th kb) to the client 12a, the system 10 accesses the next data compression map 502b. According to the compression map 502b, the next sub-unit 504c can provide the 501st kb to the 748th kb. As such, the system 10 uses the sub-unit address 656c to retrieve the encrypted compressed data for the sub-unit 504c. The system 10 then uses the encryption key to decrypt the data from sub-unit 504c. After the data from the sub-unit 504c is decrypted, the system 10 then de-compresses the data (having a size of 5 kb) from the sub-unit 504c to obtain the uncompressed data (having a size of 248 kb), and transmits it to the client 12a.

In the example, since sub-units 504a, 504b only provide data up to the 748th kb, in order to provide the remaining requested data (the 749th kb to the 750th kb) to the client 12a, the system 10 accesses the next sub-unit 504d. According to the compression map 502b, the next sub-unit 504d can provide the 749th kb to the 750th kb. As such, the system 10 uses the sub-unit address 656d to retrieve the encrypted compressed data for the sub-unit 504d. The system 10 then uses the encryption key to decrypt the data from sub-unit 504d. After the data from the sub-unit 504d is decrypted, the system 10 then de-compresses the data (having a size of 30 kb) from the sub-unit 504d to obtain the uncompressed data (having a size of 252 kb), and transmits it to the client 12a.

In the above embodiments, the same encryption key is used to encrypt and decrypt sub-units 504 from different compression units 500. In other embodiments, different keys may be used to encrypt and decrypt different sub-units 504 associated with the same compression unit 500. In such cases, the compression map 502 of a compression unit 500 may include information regarding the encryption keys (e.g., locations of the encryption keys) for decrypting different sub-units 504 of the compression unit 500. In further embodiments, different compression units 500 may use different encryption keys, but sub-units 504 associated with the same compression unit 500 use the same encryption key.

FIG. 16B illustrates a variation of the example of the metadata shown in FIG. 16A, particularly showing that the compression units "CU1," "CU2," and "CU3" have different encryption criteria. Compression unit "CU1" has an encryption flag that is set to "ON," indicating that the compression unit "CU1" has been encrypted, wherein the encryption key is located at address "K1." Compression unit "CU2" (which may be, for example, a non-secure portion of the LOB file) has an encryption flag that is set to "OFF," indicating that the compression unit "CU2" has not been encrypted. Compression unit "CU3" has an encryption flag that is set to "ON," indicating that the compression unit "CU3" has been encrypted, wherein the encryption key is located at address "K2." In the illustrated example, the system 10 is configured to use the encryption key located at "K1" to decrypt different sub-unit(s) 504 of the compression unit "CU1," and the encryption key located at "K2" to decrypt different sub-unit(s) 504 of the compression unit "CU3."

In other embodiments, instead of storing the encryption key address(es) in the database 14, the system 10 may be configured to store the encryption key identifier(s) in the database 14. In such cases, the encryption key identifier(s) may be used by the system 10 to obtain encryption key(s) from the database 14, or from another location.

In further embodiments, the system 10 may use an encryption key management system, in which the encryption key is encrypted to provide an additional level of security. In such cases, the encrypted encryption key is stored in another system (e.g., a second database). If the system 10 needs to obtain the encryption key, the system 10 then sends a request to the system, which in turn, obtains a master key from yet another system (e.g., a third database) 10. The second system then uses the master key to decrypt the encrypted encryption key, and transmits the decrypted encryption key to the system 10. Encryption key management system has been described in U.S. patent application Ser. No. 11/084,346, entitled "METHOD AND APPARATUS FOR EXPIRING ENCRYPTED DATA", the disclosure of which is hereby expressly incorporated by reference in its entirety.

In any of the embodiments described herein, the system 10 may be configured to allow a data processing threshold to be inputted (e.g., via a user interface) for the data encryption module 26. The data processing threshold for the data encryption module 26 is the prescribed size of a portion of the LOB file 50 to be processed by the data encryption module 26. For example, the data encryption module 26 may be configured to keep track a size of the portion of the LOB file that has been processed by the data compression module 24. When the size reaches or exceeds the prescribed data processing threshold for the data encryption module 26, the data encryption module 26 then performs the various functions associated with data encryption described herein. The data processing threshold for the data encryption module 26 may be the same as, or different from, that for the data de-duplication module 22 and/or the data compression module 24.

As described in the above embodiments, the system 10 of FIG. 14 includes the de-duplication module 22, the data compression module 24, and the data encryption module 26. However, in other embodiments, the system 10 may not include the data compression module 24. In such cases, the data encryption module 26 is not configured to receive LOB file data from the data compression module 24, but from the de-duplication module 22. In such cases, the data compression module 24 is configured to encrypt uncompressed data from the LOB file 50. In other embodiments, the system 10 may not include the de-duplication module 22. In further embodiments, the system 10 may not include both the de-duplication module 22 and the data compression module 24.

Figure 17A:
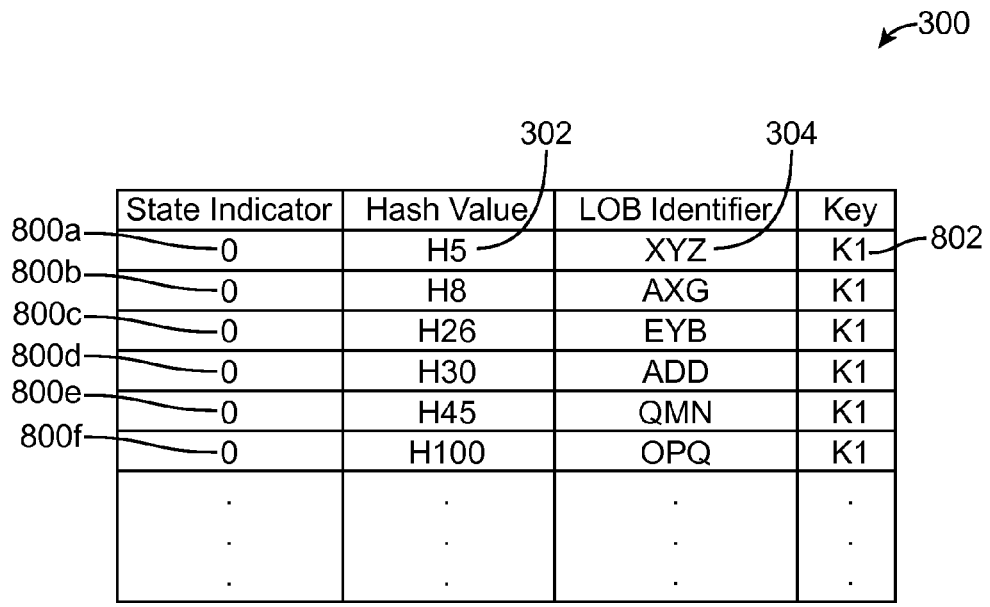
FIG. 17A-17B illustrate a technique of using a state indicator to keep track of a file that has been re-keyed.
Figure 17B:
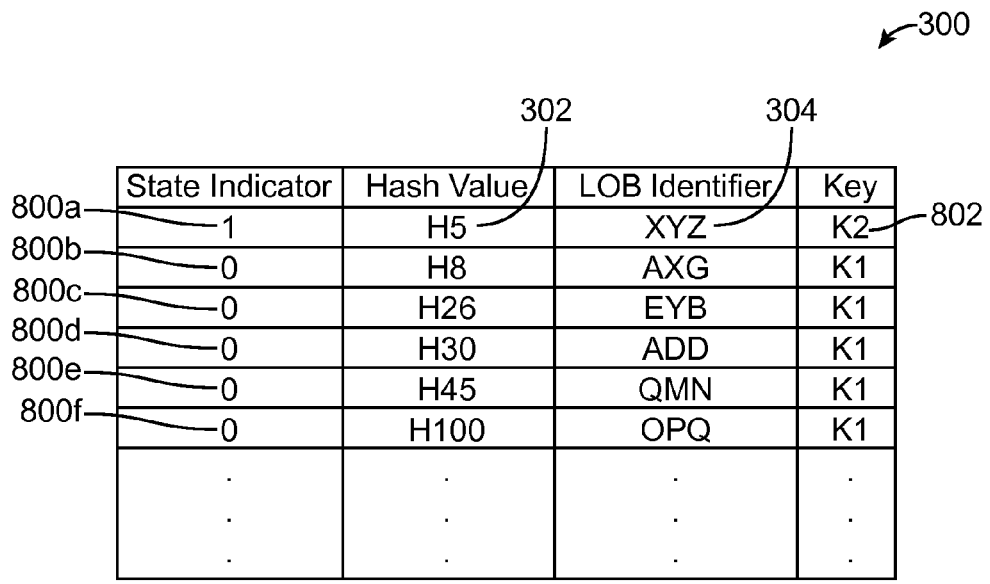

In any of the embodiments described herein, the metadata may further include a state indicator for tracking a state of a LOB file. The state indicator may be used for different purposes. FIGS. 17A-17B illustrate an example of using state indicators 800 to keep track of which LOB file(s) 50 has been re-keyed. As shown in FIG. 17A, the LOB files 50a-50f initially all have the same encryption key "K1," and their corresponding state indicators 800a-800f are "0." In some cases, for added security or maintenance, it may be desirable to change the encryption key (re-key) for the LOB files 50 after a certain prescribed period. To re-key for LOB file 50a, the system 10 first obtains the original encryption key "K1" to decrypt the LOB file 50a. The system 10 then obtains a new encryption key "K2" to encrypt the LOB file 50a. After the re-key process has been performed form the LOB file 50a, the state indicator 800a for the LOB file 50a is then changed from "0" to "1," indicating that the LOB file 50a has been re-keyed. The system 10 then performs the re-key process for the next LOB file 50b, and so forth, until the last LOB file 50f has been re-keyed.

Using a state indicator 800 to keep track of a state of a LOB file is advantageous in that it allows the system 10 to determine where in the table 300 to resume a re-key process if there is a system failure or error. For example, if there is a system failure or error that occurs after the fourth LOB file 50d has been re-keyed, the state indicators 800a-800d would be "1" for the LOB files 50a-50d. In such cases, the system 10 looks for the next state indicator that is "0" (which is the one for LOB file 50e), and determines that the re-key process needs to be resumed starting from LOB file 50e. In existing systems, maintenance of the files stored in a table is performed on a table-by-table basis. As such, if an error occurs before all of the items in the table are processed, the maintenance would need to be re-started from the beginning. This results in a waste of system resources.

In other embodiments, instead of using a state indicator 800 for each LOB file 50, a state indicator may be used for each compression unit 500 to indicate a state of the compression unit 500 (e.g., whether the compression unit 500 has been re-keyed). In further embodiments, a state indicator 800 may be used for each sub-unit 504 to indicate a state of the sub-unit 504 (e.g., whether the sub-unit 504 has been re-keyed).

In further embodiments, instead of using the state indicator 800 to determine which LOB file 50, compression unit 500, or sub-unit 504, has been re-keyed or not, the state indicator 800 may be used to determine which LOB file 50, compression unit 500, or sub-unit 504 has been re-compressed using a different compression algorithm.

It should be noted that the system 10 needs not perform all of the steps described previously, and that the system 10 can be configured to perform only one or some of the steps in FIG. 15. For example, in other embodiments, the stored data may not be encrypted, and the system 10 does not perform data decryption. In other embodiments, the stored data may not be compressed, and the system 10 does not perform data decompression. In further embodiments, the stored data may not be encrypted and compressed. In such case, the system 10 does not perform data decryption and data decompression.

Computer System Architecture

Figure 18:
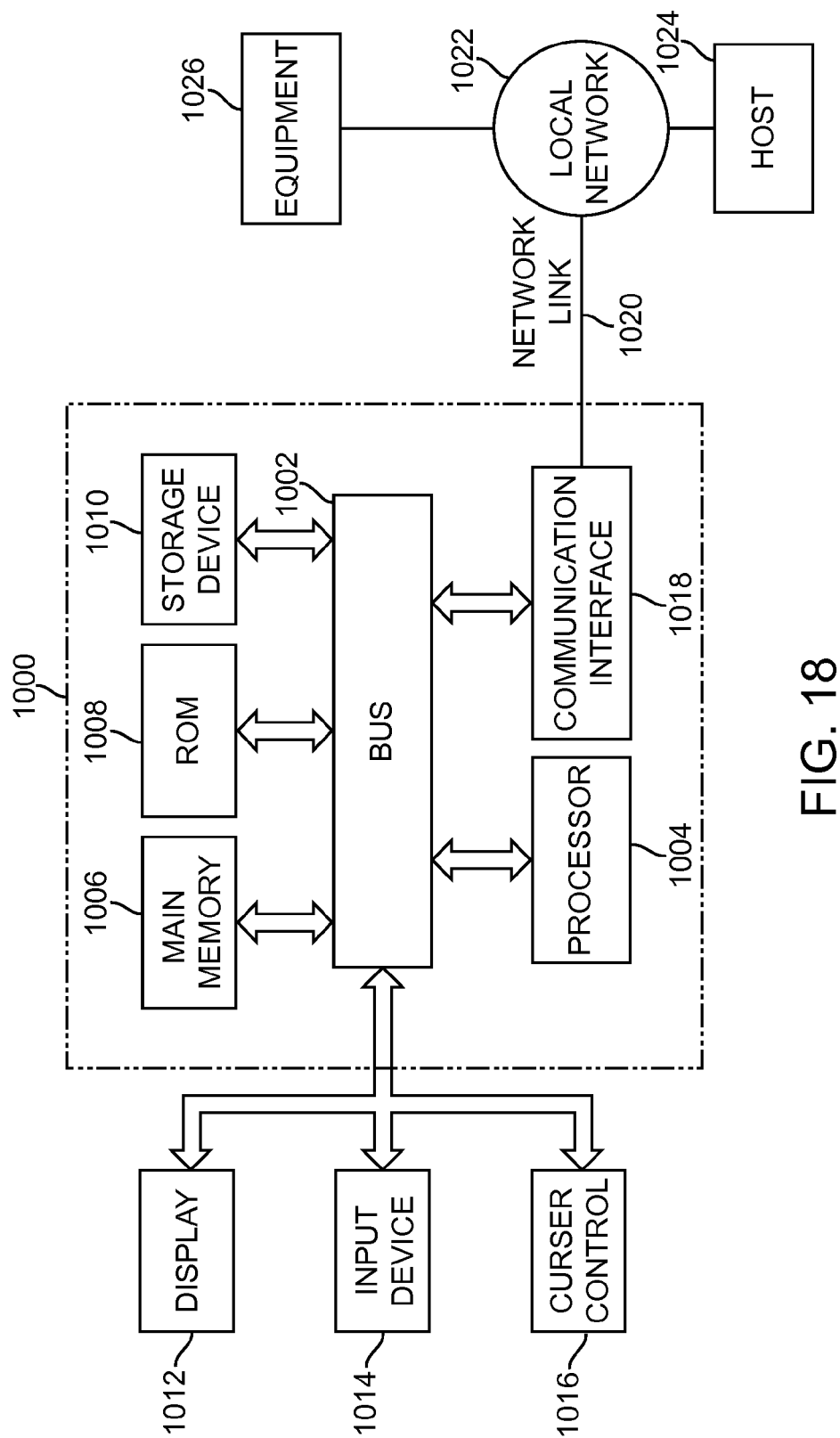
FIG. 18 illustrates a block diagram of a computer system that can be used to perform various functions described herein in accordance with some embodiments.

FIG. 18 is a block diagram illustrating an embodiment of a computer system 1000 that can be used to perform various functions described herein. In some embodiments, the computer system 1000 may be used to implement the system 10. In other embodiments, the computer system 1000 may be used to implement any of the components of the system 10, such as, the data receiving module 20, the data de-duplication module 22, the data compression module 24, or the data encryption module 26. In further embodiments, the computer system 1000 may be used to implement the database 14.

Computer system 1000 includes a bus 1002 or other communication mechanism for communicating information, and a processor 1004 coupled with the bus 1002 for processing information. The processor 1004 may be a processor in the system 10 of FIG. 1 that is used to perform the various functions described herein. The computer system 1000 also includes a main memory 1006, such as a random access memory (RAM) or other dynamic storage device, coupled to the bus 1002 for storing information and instructions to be executed by the processor 1004. The main memory 1006 also may be used for storing temporary variables or other intermediate information during execution of instructions to be executed by the processor 1004. The computer system 1000 further includes a read only memory (ROM) 1008 or other static storage device coupled to the bus 1002 for storing static information and instructions for the processor 1004. A data storage device 1010, such as a magnetic disk or optical disk, is provided and coupled to the bus 1002 for storing information and instructions.

The computer system 1000 may be coupled via the bus 1002 to a display 1012, such as a cathode ray tube (CRT), for displaying information to a user. An input device 1014, including alphanumeric and other keys, is coupled to the bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. The display 1012, input device 1014, and the cursor control 1016 may be used to implement various user interfaces described herein.

In some embodiments, the computer system 1000 can be used to perform various functions described herein. According to some embodiments of the invention, such use is provided by computer system 1000 in response to processor 1004 executing one or more sequences of one or more instructions contained in the main memory 1006. Those skilled in the art will know how to prepare such instructions based on the functions and methods described herein. Such instructions may be read into the main memory 1006 from another computer-readable medium, such as storage device 1010. Execution of the sequences of instructions contained in the main memory 1006 causes the processor 1004 to perform the process steps described herein. One or more processors in a multi-processing arrangement may also be employed to execute the sequences of instructions contained in the main memory 1006. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to the processor 1004 for execution. Such a medium may take many forms, including but not limited to, non-volatile media, volatile media, and transmission media. Non-volatile media includes, for example, optical or magnetic disks, such as the storage device 1010. Volatile media includes dynamic memory, such as the main memory 1006. Transmission media includes coaxial cables, copper wire and fiber optics, including the wires that comprise the bus 1002. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer-readable media may be involved in carrying one or more sequences of one or more instructions to the processor 1004 for execution. For example, the instructions may initially be carried on a magnetic disk of a remote computer. The remote computer can load the instructions into its dynamic memory and send the instructions over a telephone line using a modem. A modem local to the computer system 1000 can receive the data on the telephone line and use an infrared transmitter to convert the data to an infrared signal. An infrared detector coupled to the bus 1002 can receive the data carried in the infrared signal and place the data on the bus 1002. The bus 1002 carries the data to the main memory 1006, from which the processor 1004 retrieves and executes the instructions. The instructions received by the main memory 1006 may optionally be stored on the storage device 1010 either before or after execution by the processor 1004.

The computer system 1000 also includes a communication interface 1018 coupled to the bus 1002. The communication interface 1018 provides a two-way data communication coupling to a network link 1020 that is connected to a local network 1022. For example, the communication interface 1018 may be an integrated services digital network (ISDN) card or a modem to provide a data communication connection to a corresponding type of telephone line. As another example, the communication interface 1018 may be a local area network (LAN) card to provide a data communication connection to a compatible LAN. Wireless links may also be implemented. In any such implementation, the communication interface 1018 sends and receives electrical, electromagnetic or optical signals that carry data streams representing various types of information.

The network link 1020 typically provides data communication through one or more networks to other devices. For example, the network link 1020 may provide a connection through local network 1022 to a host computer 1024 or to equipment/device 1026, or a switch operatively coupled to any of the devices described herein. The data streams transported over the network link 1020 can comprise electrical, electromagnetic or optical signals. The signals through the various networks and the signals on the network link 1020 and through the communication interface 1018, which carry data to and from the computer system 1000, are exemplary forms of carrier waves transporting the information. The computer system 1000 can send messages and receive data, including program code, through the network(s), the network link 1020, and the communication interface 1018.

Although particular embodiments have been shown and described, it will be understood that it is not intended to limit the claimed inventions, and it will be obvious to those skilled in the art that various changes and modifications may be made without departing from the spirit and scope of the application. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed:

1. A method of processing data from a file, comprising:
   using at least one processor to perform a process, the process comprising:
   identifying multiple portions of data for a large object (LOB), wherein a portion of the multiple portions corresponds to an identifier that indicates a compression state of the portion, and the compression state includes an uncompressed state, a first compressed state associated with a first compression scheme, and a second compressed state associated with a second compression scheme;
   compressing the portion for storage in a first compression unit using the first compression scheme when the compression state of the portion indicates the first compressed state;
   compressing the portion using the second compression scheme for storage in the first compression unit when the compression state of the portion indicates the second compressed state; and
   storing the portion uncompressed in the first compression unit when the compression state of the portion indicates the uncompressed state, wherein two compression units used for storing the large object have different compression requirements.

2. The method of claim 1, wherein the large object (LOB) comprises an LOB file.

3. The method of claim 2, wherein the LOB file comprises an image file or an audio file.

4. The method of claim 2, the process further comprising: providing random access to a part of the large object by using one or more compressed sizes of one or more sub-units of the first compression unit and at least some of physical addresses of the one or more sub-units, rather than deriving the physical addresses of the one or more sub-units from other information.

5. The method of claim 1, further comprising determining a data processing threshold, wherein the is obtained based at least in part upon the data processing threshold.

6. The method of claim 1, further comprising obtaining another portion of the large object, wherein a first compression unit comprises a first sub-unit created by compressing a first portion of the large object, and a second sub-unit created by compressing the another portion of the file.

7. The method of claim 6, further comprising creating a data compression map associated with the first compression unit.

8. The method of claim 7, wherein the data compression map comprises information regarding a storage location of the first and second sub-units.

9. The method of claim 7, wherein the data compression map comprises information regarding a size of the first sub-unit, a size of the second sub-unit, a size of the first portion, and a size of the another portion.

10. The method of claim 1, further comprising storing a data compression flag, the data compression flag indicating that data compression has been performed.

11. The method of claim 1, further comprising storing a data compression level indicator, the data compression level indicator indicating a level of data compression performed.

12. The method of claim 1, further comprising determining a size of the large object, wherein two or more compression units are created if the size exceeds a prescribed size.

13. The method of claim 1, further comprising determining a type of the large object, wherein two or more compression units are created if the type matches a prescribed type.

14. A system for processing data from a file, comprising:
a processor that is to:
identify multiple portions of data for a large object (LOB), wherein a portion of the multiple portions corresponds to an identifier that indicates a compression state of the portion, and the compression state includes an uncompressed state, a first compressed state associated with a first compression scheme, and a second compressed state associated with a second compression scheme;
compress the portion for storage in a first compression unit using the first compression scheme when the compression state of the portion indicates the first compressed state;
compress the portion using the second compression scheme for storage in the first compression unit when the compression state of the portion indicates the second compressed state;
a non-transitory computer-readable medium that is to store the portion uncompressed in the first compression unit when the compression state of the portion indicates the uncompressed state, wherein two compression units used for storing the large object have different compression requirements.

15. The system of claim 14, wherein the processor is further to determine a data processing threshold, wherein the first portion of the large object is obtained based at least in part upon the data processing threshold.

16. A computer product having a non-transitory computer-readable medium storing a set of instruction, wherein an execution of the instruction by a processor causes a process to be performed, the process comprising:
identifying multiple portions of data for a large object (LOB), wherein a portion of the multiple portions corresponds to an identifier that indicates a compression state of the portion, and the compression state includes an uncompressed state, a first compressed state associated with a first compression scheme, and a second compressed state associated with a second compression scheme;
compressing the portion for storage in a first compression unit using the first compression scheme when the compression state of the portion indicates the first compressed state;
compressing the portion using the second compression scheme for storage in the first compression unit when the compression state of the portion indicates the second compressed state; and
storing the portion uncompressed in the first compression unit when the compression state of the portion indicates the uncompressed state, wherein two compression units used for storing the large object have different compression requirements.

17. The product of claim 16, further comprising determining a data processing threshold, wherein the first portion of the large object is obtained based at least in part upon the data processing threshold.

18. A method of processing data from a large object (LOB), comprising:
using at least one processor to perform a process, the process comprising:
obtaining a first portion of the large object, wherein the first portion of multiple portions corresponds to a first identifier that indicates a first compression state of the first portion, and the first compression state includes an uncompressed state, a first compressed state associated with a first compression scheme, and a second compressed state associated with a second compression scheme;
obtaining a second portion of the large object, wherein the second portion of the multiple portions corresponds to a second identifier that indicates a second compression state of the second portion, and the second compression state includes the uncompressed state, a first compressed state associated with a first compression scheme, and a second compressed state associated with a second compression scheme;
compressing the first portion or the second portion for storage in a first compression unit using a corresponding compression scheme when a respective compression state of the first portion or the second portion indicates a compressed state;
compressing the first portion or the second portion using the respective compression scheme for storage in the first compression unit when the respective compression state of the first portion or the second portion indicates another compressed state; and
storing the first portion or the second portion uncompressed in the first compression unit when the respective compression state of the first portion or the second portion indicates the uncompressed state, wherein two compression units used for storing the large object have different compression requirements;

storing the first sub-unit and the second sub-unit in a volatile or non-volatile computer-readable medium such that the first sub-unit and the second sub-unit are to be individually accessed.

19. The method of claim 18, wherein the large object comprises an LOB file.

20. The method of claim 19, wherein the LOB file comprises an image file or an audio file.

21. The method of claim 19, the process further comprising: providing random access to a part of the large object by using one or more compressed sizes of one or more sub-units of the first compression unit and at least some of physical addresses of the one or more sub-units, rather than deriving the physical addresses of the one or more sub-units from other information.

22. The method of claim 18, further comprising determining a data processing threshold, wherein the first portion of the large object is obtained based at least in part upon the data processing threshold.

23. The method of claim 18, further comprising creating a data compression map associated with the first compression unit.

24. The method of claim 23, wherein the data compression map comprises information regarding a storage location of a first sub-unit and a second sub-unit in the first compression unit.

25. The method of claim 23, wherein the data compression map comprises information regarding a size of the first sub-unit, a size of the second sub-unit, a size of the first portion, and a size of the second portion.

26. The method of claim 18, further comprising storing a data compression flag, the data compression flag indicating that data compression has been performed.

27. The method of claim 18, further comprising storing a data compression level indicator, the data compression level indicator indicating a level of data compression performed.

28. The method of claim 18, further comprising determining a size of the large object, wherein two or more compression units are created if the size exceeds a prescribed size.

29. The method of claim 18, further comprising determining a type of the large object, wherein two or more compression units are created if the type matches a prescribed type.

30. A system for processing data from a large object, comprising:
a processor that is to:
obtain a first portion and a second portion of the large object, wherein
the first portion of multiple portions corresponds to a first identifier that indicates a first compression state of the first portion, and the first compression state includes an uncompressed state, a first compressed state associated with a first compression scheme, and a second compressed state associated with a second compression scheme, and
the second portion of the multiple portions corresponds to a second identifier that indicates a second compression state of the second portion, and the second compression state includes the uncompressed state, a first compressed state associated with a first compression scheme, and a second compressed state associated with a second compression scheme;
compress the first portion or the second portion for storage in a first compression unit using a corresponding compression scheme when a respective compression state of the first portion or the second portion indicates a compressed state;
compress the first portion or the second portion using the respective compression scheme for storage in the first compression unit when the respective compression state of the first portion or the second portion indicates another compressed state; and
store the first portion or the second portion uncompressed in the first compression unit when the respective compression state of the first portion or the second portion indicates the uncompressed state, wherein two compression units used for storing the large object have different compression requirements.

31. The system of claim 30, wherein the processor is further to determine a data processing threshold, wherein the first portion of the large object is obtained based at least in part upon the data processing threshold.

32. A computer product having a non-transitory computer-readable medium storing a set of instruction, wherein an execution of the instruction by using a processor causes a process to be performed, the process comprising:
obtaining a first portion of a large object (LOB), wherein the first portion of multiple portions corresponds to a first identifier that indicates a first compression state of the first portion, and the first compression state includes an uncompressed state, a first compressed state associated with a first compression scheme, and a second compressed state associated with a second compression scheme;
obtaining a second portion of the large object, wherein the second portion of the multiple portions corresponds to a second identifier that indicates a second compression state of the second portion, and the second compression state includes the uncompressed state, a first compressed state associated with a first compression scheme, and a second compressed state associated with a second compression scheme;
compressing the first portion or the second portion for storage in a first compression unit using a corresponding compression scheme when a respective compression state of the first portion or the second portion indicates a compressed state;
compressing the first portion or the second portion using the respective compression scheme for storage in the first compression unit when the respective compression state of the first portion or the second portion indicates another compressed state; and
storing the first portion or the second portion uncompressed in the first compression unit when the respective compression state of the first portion or the second portion indicates the uncompressed state, wherein two compression units used for storing the large object have different compression requirements.

33. The product of claim 32, further comprising determining a data processing threshold, wherein the first portion of the large object is obtained based at least in part upon the data processing threshold.

34. A method of processing data from a large object, comprising:
using at least one processor to perform a process, the process comprising:
receiving a request to access a first portion of the large object, wherein
the first portion of multiple portions of the large object corresponds to a first identifier that indicates a first compression state of the first portion, and the first compression state includes an uncompressed state, a first compressed state associated with a first compression scheme, and a second compressed state associated with a second compression scheme;

decompressing the first portion from a first compression unit in storage using the first compression scheme when the first compression state of the first portion indicates the first compressed state;

decompressing the first portion using the second compression scheme from the first compression unit in the storage when the first compression state of the first portion indicates the second compressed state; and providing the first portion uncompressed from the first compression unit in the storage when the first compression state of the first portion indicates the uncompressed state, wherein two compression units used for storing the large object have different compression requirements.

35. The method of claim 34, wherein the large object comprises an LOB file.

36. The method of claim 35, wherein the LOB file comprises an image file or an audio file.

37. The method of claim 35, the process further comprising: providing random access to a part of the large object by using one or more compressed sizes of one or more sub-units of the first compression unit and at least some of physical addresses of the one or more sub-units, rather than deriving the physical addresses of the one or more sub-units from other information.

38. The method of claim 34, further comprising transmitting the uncompressed data in the first portion in response to the request.

39. The method of claim 34, further comprising determining whether data in the first portion of the object is compressed.

40. The method of claim 34, further comprising determining the first compression unit that includes a sub-unit, wherein the sub-unit comprises uncompressed data of at least a part of the first portion.

41. The method of claim 34, further comprising determining a plurality of sub-units, wherein the plurality of sub-units comprise uncompressed data of the first portion.

42. The method of claim 41, wherein one of the plurality of sub-units is associated with the first compression unit, and another one of the plurality of sub-units is associated with a different compression unit in the storage.

43. The method of claim 41, wherein the plurality of sub-units are associated with the first compression unit.

44. The method of claim 41, wherein the plurality of sub-units are determined by accessing one or more data compression maps.

45. The method of claim 34, further comprising determining a specific decompression algorithm to use for de-compressing data in the first portion.

46. A system for processing data from a large object, comprising:

a processor that is to:

receive a request to access a first portion of the large object, wherein the first portion of multiple portions of the large object corresponds to a first identifier that indicates a first compression state of the first portion, and the first compression state includes an uncompressed state, a first compressed state associated with a first compression scheme, and a second compressed state associated with a second compression scheme;

decompressing the first portion from a first compression unit in storage using the first compression scheme when the first compression state of the first portion indicates the first compressed state;

decompressing the first portion using the second compression scheme from the first compression unit in the storage when the first compression state of the first portion indicates the second compressed state; and providing the first portion uncompressed from the first compression unit in the storage when the first compression state of the first portion indicates the uncompressed state, wherein two compression units used for storing the large object have different compression requirements.

47. The system of claim 46, wherein the processor is further to determine a specific decompression algorithm to use for de-compressing the data in the first portion.

48. A computer product having a non-transitory computer-useable medium storing a set of instruction, wherein an execution of the instruction by a processor causes a process to be performed, the process comprising:

receiving a request to access a first portion of a large object (LOB)the file, wherein the first portion of multiple portions of the large object corresponds to a first identifier that indicates a first compression state of the first portion, and the first compression state includes an uncompressed state, a first compressed state associated with a first compression scheme, and a second compressed state associated with a second compression scheme;

decompressing the first portion from a first compression unit in storage using the first compression scheme when the first compression state of the first portion indicates the first compressed state;

decompressing the first portion using the second compression scheme from the first compression unit in the storage when the first compression state of the first portion indicates the second compressed state; and providing the first portion uncompressed from the first compression unit in the storage when the first compression state of the first portion indicates the uncompressed state, wherein two compression units used for storing the large object have different compression requirements.

49. The product of claim 48, further comprising determining a specific decompression algorithm to use for de-compressing the data in the first portion.

50. A method of processing data from a large object, comprising:

receiving a request to access a portion of the large object;

determining one or more sub-units of a compression unit that include data associated with the portion of the large object, wherein a sub-unit of the one or more sub-units corresponds to an identifier that indicates a compression state of the sub-unit, and the compression state includes an uncompressed state, a first compressed state associated with a first compression scheme, and a second compressed state associated with a second compression scheme;

decompressing the data for at least a part of the portion from the sub-unit in the compression unit in the storage using the first compression scheme when the compression state of the sub-unit indicates the first compressed state;

decompressing the data for the at least the part of the portion from the sub-unit in the compression unit in the storage using the second compression scheme when the compression state of the sub-unit indicates the second compressed state; and providing the data uncompressed from the sub-unit in the compression unit in the storage when the compression state of the sub-unit indicates the uncompressed state, wherein two compression units used for storing the large object have different compression requirements.

51. The method of claim 50, wherein the data in the one or more sub-units are encrypted, and the method further comprises decrypting the data in the one or more sub-units.

52. A system for processing data from a file, comprising:
a processor that is to:
receive a request to access a portion of the large object;
determine one or more sub-units of a compression unit that include data associated with the portion of the large object, wherein
 a sub-unit of the one or more sub-units corresponds to an identifier that indicates a compression state of the sub-unit, and the compression state includes an uncompressed state, a first compressed state associated with a first compression scheme, and a second compressed state associated with a second compression scheme;
decompressing the data for at least a part of the portion from the sub-unit in the compression unit in the storage using the first compression scheme when the compression state of the sub-unit indicates the first compressed state;
decompressing the data for the at least the part of the portion from the sub-unit in the compression unit in the storage using the second compression scheme when the compression state of the sub-unit indicates the second compressed state; and
providing the data uncompressed from the sub-unit in the compression unit in the storage when the compression state of the sub-unit indicates the uncompressed state, wherein two compression units used for storing the large object have different compression requirements.

53. The system of claim 52, wherein the data in the one or more sub-units are encrypted, and the processor is further to decrypt the data in the one or more sub-units.

54. A computer product having a non-transitory computer-readable medium storing a set of instruction, wherein an execution of the instruction by using a processor causes a process to be performed, the process comprising:
receiving a request to access a portion of large object;
determining one or more sub-units of a compression unit that include data associated with the portion of the large object, wherein
 a sub-unit of the one or more sub-units corresponds to an identifier that indicates a compression state of the sub-unit, and the compression state includes an uncompressed state, a first compressed state associated with a first compression scheme, and a second compressed state associated with a second compression scheme;
decompressing the data for at least a part of the portion from the sub-unit in the compression unit in the storage using the first compression scheme when the compression state of the sub-unit indicates the first compressed state;
decompressing the data for the at least the part of the portion from the sub-unit in the compression unit in the storage using the second compression scheme when the compression state of the sub-unit indicates the second compressed state; and
providing the data uncompressed from the sub-unit in the compression unit in the storage when the compression state of the sub-unit indicates the uncompressed state, wherein two compression units used for storing the large object have different compression requirements.

55. The product of claim 54, wherein the data in the one or more sub-units are encrypted, and the process further comprising: decrypting the data in the one or more sub-units.

* * * * *